(12) United States Patent
Kuromizu

(10) Patent No.: US 8,714,763 B2
(45) Date of Patent: May 6, 2014

(54) LIGHTING DEVICE, DISPLAY DEVICE AND TELEVISION RECEIVER

(75) Inventor: Yasumori Kuromizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 194 days.

(21) Appl. No.: 13/381,705

(22) PCT Filed: Jun. 15, 2010

(86) PCT No.: PCT/JP2010/060091
§ 371 (c)(1),
(2), (4) Date: Jan. 13, 2012

(87) PCT Pub. No.: WO2011/004680
PCT Pub. Date: Jan. 13, 2011

(65) Prior Publication Data
US 2012/0105737 A1    May 3, 2012

(30) Foreign Application Priority Data
Jul. 9, 2009    (JP) .................................. 2009-162962

(51) Int. Cl.
*G09F 13/04*    (2006.01)

(52) U.S. Cl.
USPC ........................................ 362/97.2; 362/97.1

(58) Field of Classification Search
USPC ...................... 362/97.1, 97.3, 249.02, 249.01
See application file for complete search history.

(56) References Cited

U.S. PATENT DOCUMENTS

| | | | |
|---|---|---|---|
| 7,128,452 B2 * | 10/2006 | Tsai | 362/497 |
| 7,976,188 B2 * | 7/2011 | Peng | 362/249.02 |
| 2003/0223235 A1 * | 12/2003 | Mohacsi et al. | 362/240 |
| 2006/0285322 A1 * | 12/2006 | Hasei et al. | 362/225 |
| 2007/0297163 A1 | 12/2007 | Kim et al. | |
| 2008/0303977 A1 | 12/2008 | Sekiguchi et al. | |
| 2009/0027915 A1 * | 1/2009 | Kaneko | 362/555 |
| 2009/0135331 A1 | 5/2009 | Kawase | |

FOREIGN PATENT DOCUMENTS

| | | |
|---|---|---|
| JP | 2007-317423 A | 12/2007 |
| JP | 2008-41645 A | 2/2008 |
| JP | 2008-304839 A | 12/2008 |

OTHER PUBLICATIONS

Official Communication issued in International Patent Application No. PCT/JP2010/060091, mailed on Sep. 21, 2010.

* cited by examiner

*Primary Examiner* — Evan Dzierzynski
(74) *Attorney, Agent, or Firm* — Keating & Bennett, LLP

(57) ABSTRACT

The present invention aims at providing a lighting device configured to suppress uneven brightness, and a display device or a television receiver which includes the lighting device. The lighting device of the present invention includes a plurality of LEDs 16, an LED board 17S, a chassis 14, a connecting component 60, and a reflection sheet 21. The LEDs 16 are mounted on the LED board 17S. Both of the LED boards 17S and 17C are attached to the chassis 14. The connecting component 60 electrically connect the LED boards 17S and 17C to each other. The reflection sheet 21 is overlaid on light source mounted surfaces 17A. In the lighting device, the connecting component 60 is arranged on a connecting component attached surface 17B of the LED board 17S. The connecting component attached surface 17B is opposite to the surface on which the reflection sheet 21 is overlaid.

21 Claims, 22 Drawing Sheets

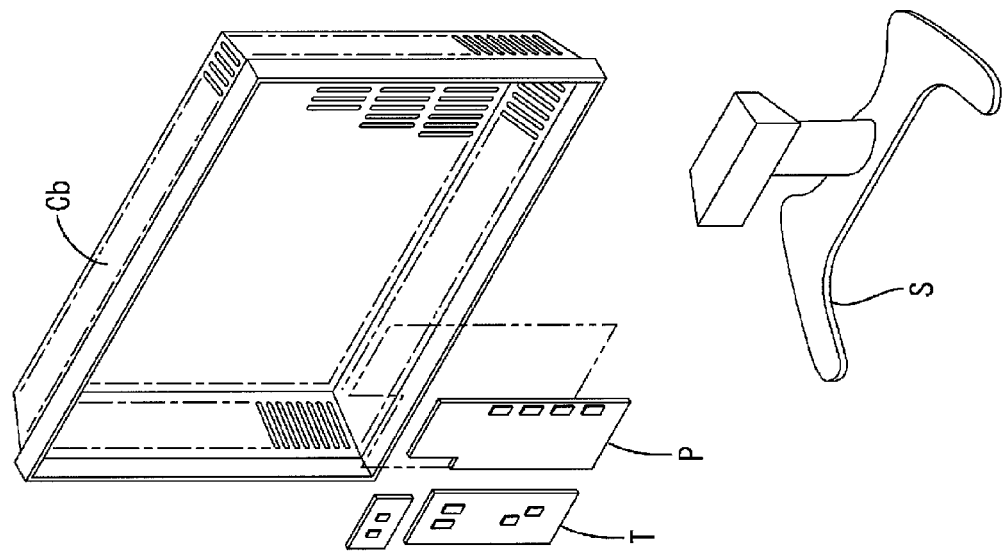
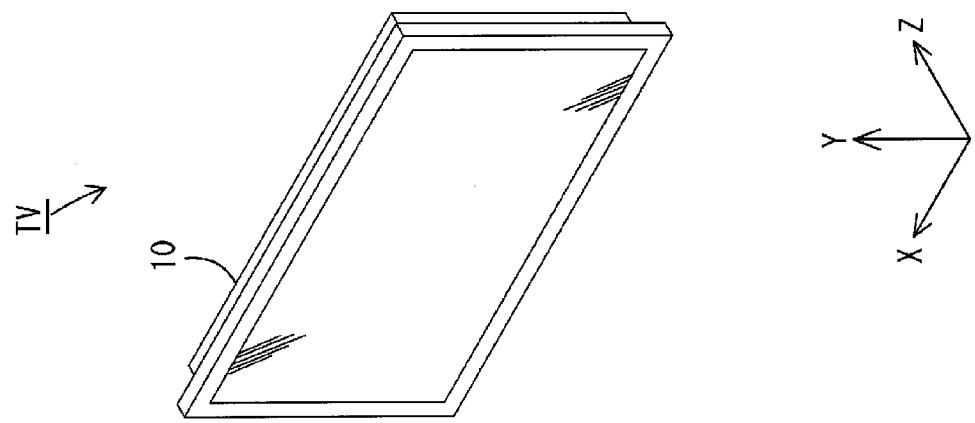
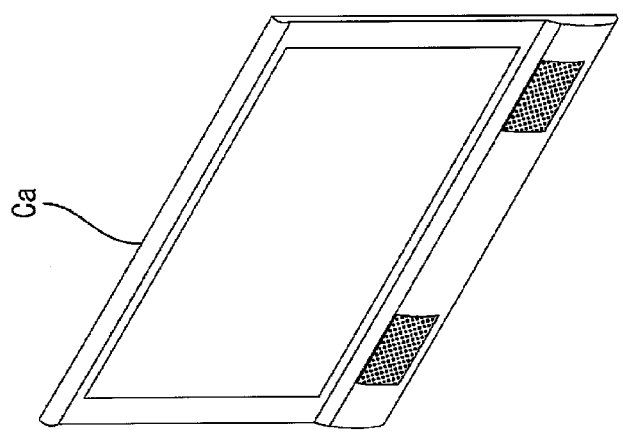
FIG.1

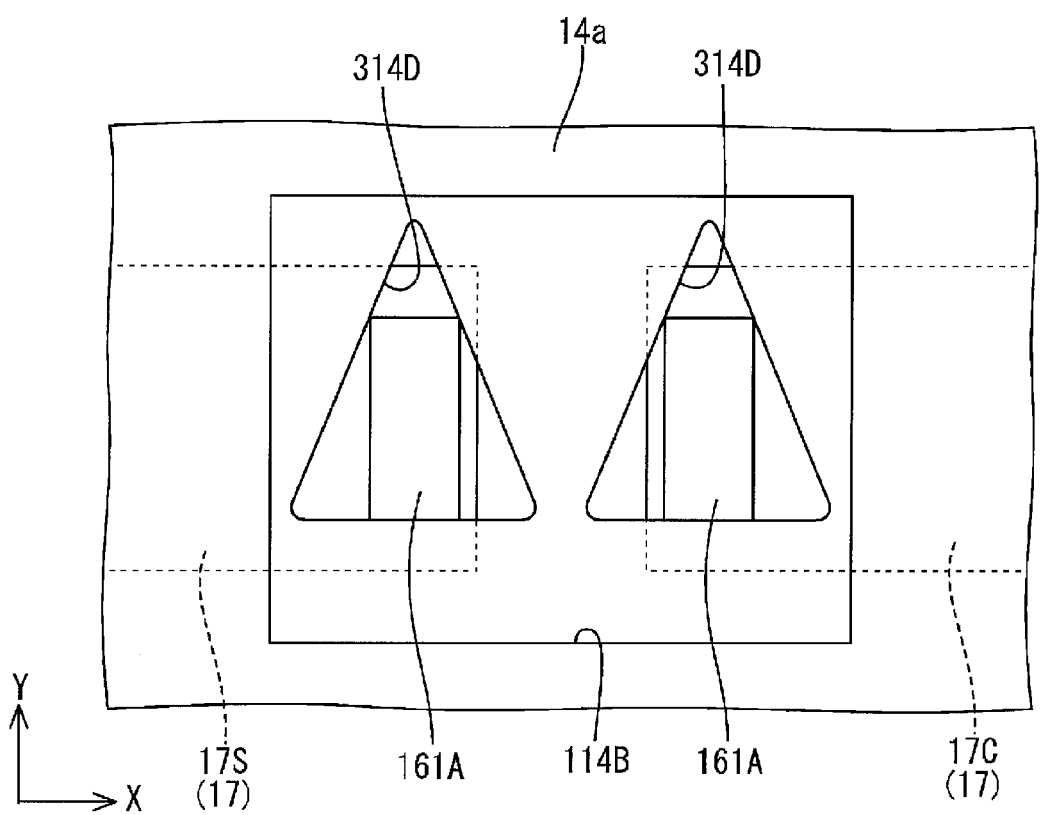

LIGHTING DEVICE, DISPLAY DEVICE AND TELEVISION RECEIVER

TECHNICAL FIELD

The present invention relates to a lighting device, a display device and a television receiver.

BACKGROUND ART

In recent years, display components of image display devices including a television receiver are shifting from conventional cathode-ray tubes to thin display elements, such as a liquid crystal panel and a plasma display panel, and applied to thin display devices. Thinning of image display devices is thereby made possible. A liquid crystal display device additionally requires a lighting device (a backlight unit) because a liquid crystal panel used therein does not emit light. Examples of a backlight unit will be described in Patent Documents 1 and 2. The backlight unit described in Patent Document 1 has a configuration in which plural boards, each having LEDs (light sources) implemented thereon, are arranged. The backlight unit described in Patent Document 2 has a configuration in which: a white or silver reflection sheet is arranged in a housing configured to house a light source therein; and light from the light source is reflected on this reflection sheet and directed toward the liquid crystal panel.

Patent Document 1: Japanese Unexamined Patent Publication No. 2007-317423

Patent Document 2: Japanese Unexamined Patent Publication No. 2008-304839

Problem to be Solved by the Invention

In order to increase brightness of the reflected light, it is preferable that the reflection sheet as described above be arranged almost entirely on an inner surface of the backlight unit. Therefore, the reflection sheet is arranged so as to overlap with boards. However, on the boards, connecting components (for example, connectors) used for electric connection between the boards are arranged. Therefore, overlapping of the reflection sheet with the boards is accompanied by the risk of causing the reflection sheet to locally surge and deform in regions having the connecting components, and, as a result, generating uneven brightness.

DISCLOSURE OF THE PRESENT INVENTION

The present invention has been completed based on the above described situation, and aims at providing a lighting device enabled to suppress uneven brightness. The present invention also aims at providing a display device and a television receiver each of which includes the lighting device.

Means for Solving the Problem

A lighting device according to the present invention includes a plurality of light sources, a first light source board, another board different from the first light source board, a board attachment member, a connecting component, and a reflection sheet. The light sources are mounted on the first light source board. Both of the first light source board and the other board are attached to the board attachment member. The connecting component electrically connects the first light source board and the other board to each other. The reflection sheet is overlaid on a mounting surface of the first light source board. The light sources are mounted on the mounting surface. In the lighting device, the connecting component is arranged on a connecting component mounted surface of the first light source board opposite to the surface on which the reflection sheet is overlaid.

In the first light source board, interference between the reflection sheet and the connecting component is prevented by adoption of a configuration in which the connecting component is arranged on the connecting component mounted surface opposite to the surface on which the reflection sheet is overlaid (i.e., the mounting surface on which the light sources are mounted). As a result, local deformation of the reflection sheet can be suppressed, and unevenness in brightness can be suppressed. Note that considered as another way to avoid interference between the reflection sheet and the connecting component is, for example, a configuration in which, after through holes are formed in the reflection sheet, the reflection sheet is arranged while the connecting components are inserted into the through holes. However, in a case of forming the through holes in the reflection sheet, the connecting components are exposed in locations where the through holes are formed. The exposure thereof deteriorates evenness in optical reflectance. As a result, uneven brightness may be caused. In this regard, the configuration of the present invention does not accompany formation of through holes used for inserting the connecting components therein, and therefore maintains evenness in optical reflectance, whereby the risk of having uneven brightness is eliminated. Therefore, the configuration is suitable.

BRIEF DESCRIPTION OF THE DRAWINGS

FIG. 1 is an exploded perspective view showing the schematic configuration of a television receiver according to a first embodiment of the present invention;

FIG. 22 is a plan view, from the back side, of a chassis having triangular through holes formed therein.

BEST MODE FOR CARRYING OUT THE INVENTION

<First Embodiment>

Figure 2:
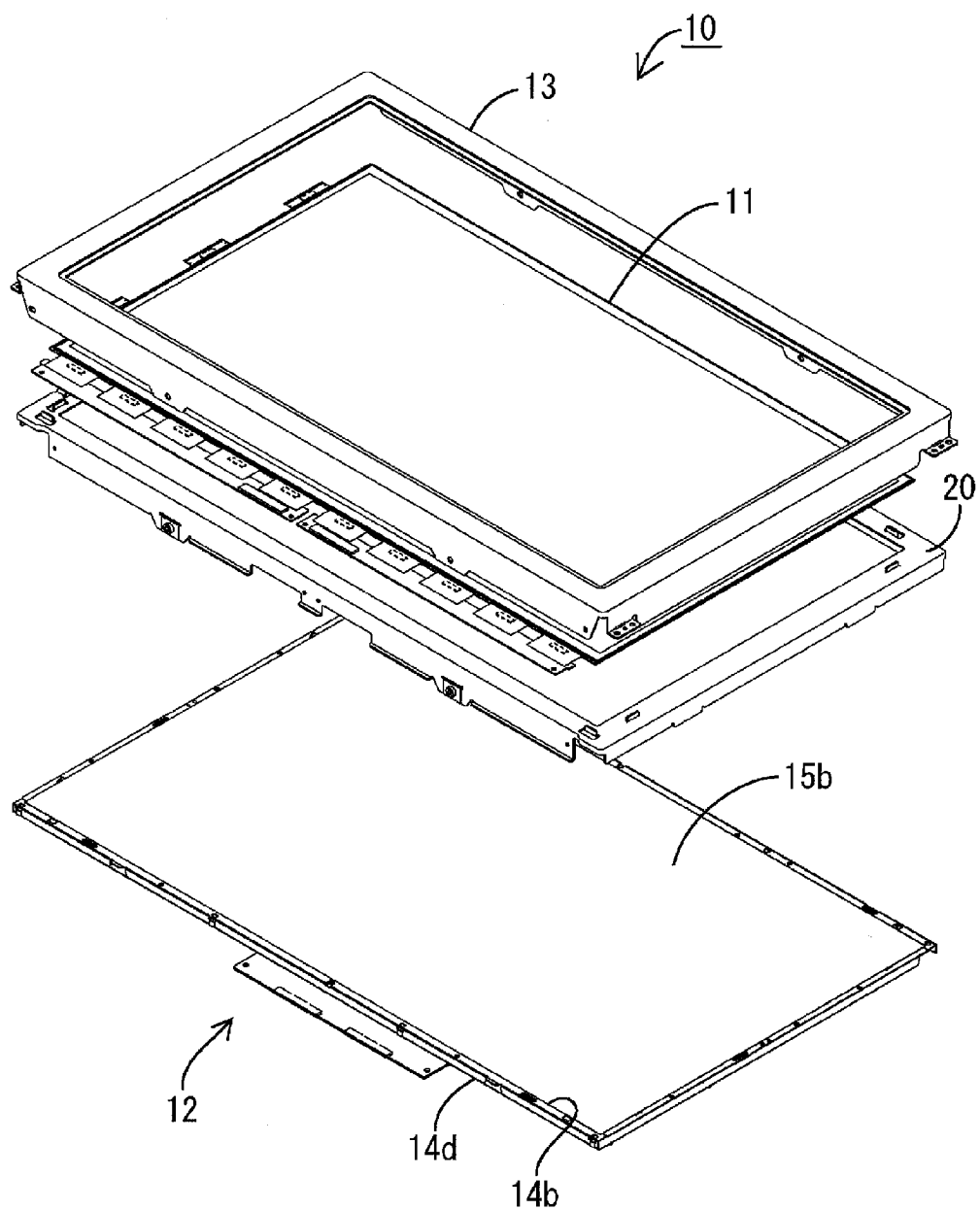
FIG. 2 is an exploded perspective view showing the schematic configuration of a liquid crystal display device.
Figure 3:
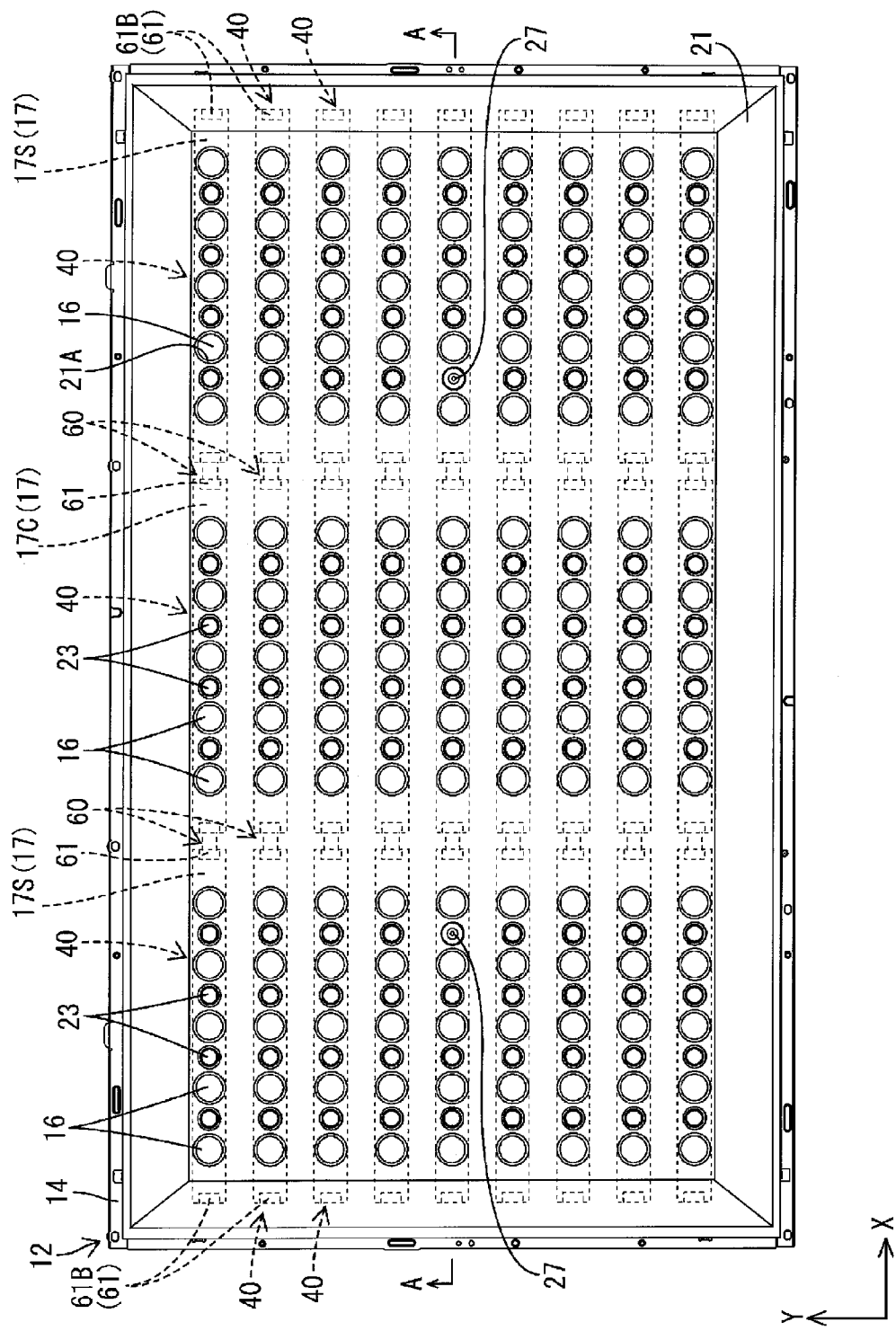
FIG. 3 is a plan view of a backlight unit.
Figure 4:
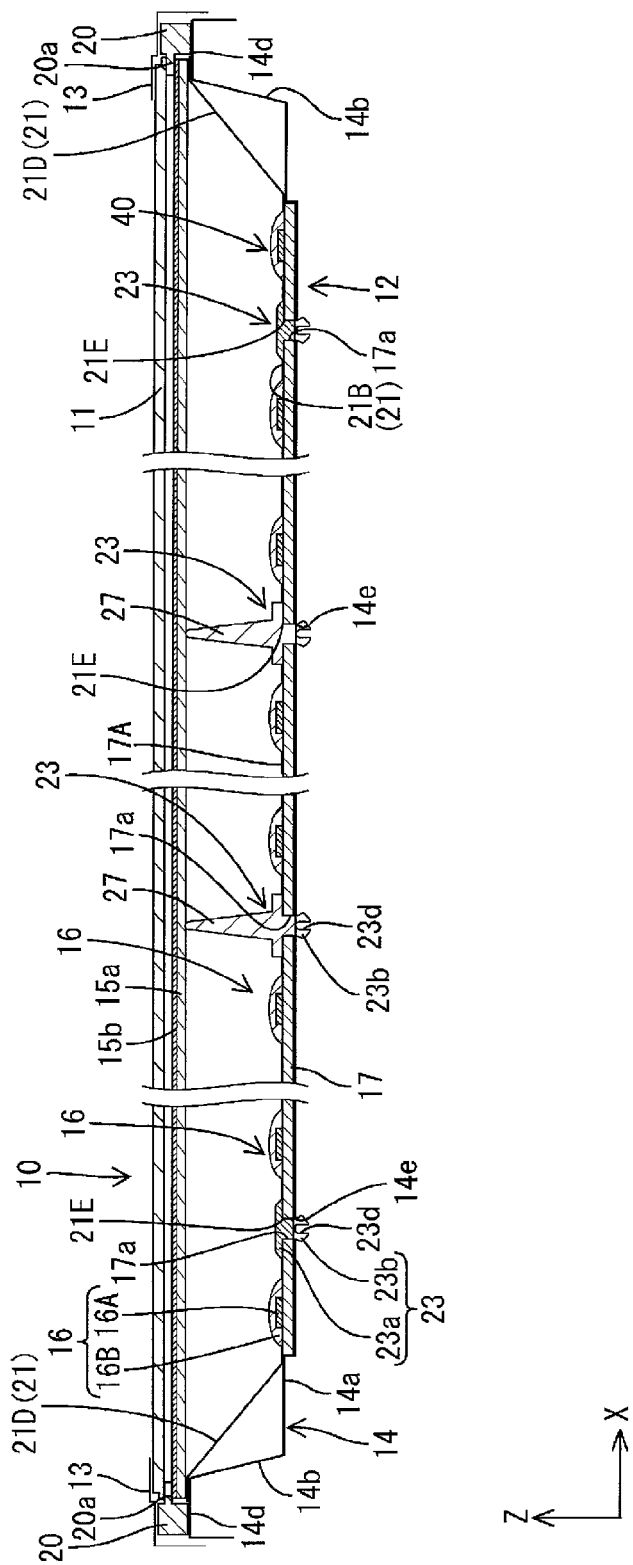
FIG. 4 is a cross-sectional view taken along the line A-A of FIG. 3.

A First embodiment of the present invention will be described with reference to FIGS. 1 to 8. Note that each of the drawings in the present embodiment has a part showing an X-axis, a Y-axis and a Z-axis, and is illustrated such that directions shown therein correspond to the directions of the respective axes. Additionally, the upper side shown in FIG. 4 is the front side, and the lower side therein is the back side.

A television receiver TV according to the present embodiment, as shown in FIG. 1, includes a liquid crystal display device 10 (display device), front and back cabinets Ca and Cb, a power supply P and a tuner T. The front and back cabinets Ca and Cb sandwich from the front and back sides, and thus house, the liquid crystal display device 10. The television receiver TV is supported by a stand S so that the display surface thereof may go along the vertical direction (Y-axis direction). The liquid crystal display device 10 as a whole has a horizontally long, rectangular shape. The liquid crystal display device 10, as shown in FIG. 2, includes: a backlight unit 12 (lighting device) which is an external light source; and a liquid crystal panel 11 (display panel) configured to display using light emitted from the backlight unit 12. These elements are integrally held by a frame-shaped bezel 13.

Next, the liquid crystal panel 11 and the backlight unit 12 that constitute the liquid crystal display device 10 will be described. Out of these elements, the liquid crystal panel 11 is rectangular in a plan view. The liquid crystal panel 11 has a pair of glass substrates bonded to each other with a predetermined gap interposed therebetween, and has liquid crystal enclosed in between these glass substrates. On one of the glass substrates, switching components (for example, TFTs) connected to source lines and gate lines which are perpendicular to each other, pixel electrodes connected to the switching components, and an alignment film and the like are provided. On the other glass substrate, color filters having color sections such as R (red), G (green) and B (blue) color sections arranged in a predetermined pattern, counter electrodes, and an alignment film and the like are provided. The glass substrates have polarizing plates on outer surfaces thereof.

The backlight unit 12 will be described in detail next. As shown in FIGS. 2 and 3, the backlight unit 12 includes a substantially box-shaped chassis 14 opened to the front side, a plurality of light source units 40 attached to the chassis 14, a reflection sheet 21 arranged along the inner surface of the chassis 14, a diffuser 15a arranged so as to cover the opening of the chassis 14, and an optical sheet 15b laminated on the front side of the diffuser 15a.

The chassis 14 (board attachment member) is made of, for example, metal such as an aluminum-based material, and is substantially rectangular as a whole in a plan view. As shown in FIGS. 3 and 4, the chassis 14 includes a bottom plate 14a which is rectangular as in the case of the liquid crystal panel 11, side plates 14b rising up from the outer ends of each side of the bottom plate 14a, and receiving plates 14d projecting outwards from the rising ends of the side plates 14b. Additionally, the chassis 14 is arranged in a direction along the long sides thereof aligned with the horizontal direction (X-axis direction) and a direction along the short sides thereof matched with the vertical direction (Y-axis direction).

Each of the light source units 40 includes: LEDs 16 (light emitting diodes) which are light sources; and LED boards 17 each having plural ones (five in the present embodiment) of the LEDs 16 mounted thereon. On the bottom plate 14a of the chassis 14, fifteen LEDs 16 are arrayed in the X-axis direction by lining up plural ones (three) of the light source units 40 in the X-axis direction. A plurality of groups of the light source units 40 thus lined up in the X-axis direction is arranged into plural (nine in the present embodiment) lines in the direction along the short sides of the chassis 14 (Y-axis direction) with a constant distance between mutually adjacent ones of the groups. Thus, the plural light source units 40, and therefore the plural LEDs 16, are two-dimensionally arranged within one face of the bottom plate 14a of the chassis 14.

Figure 6:
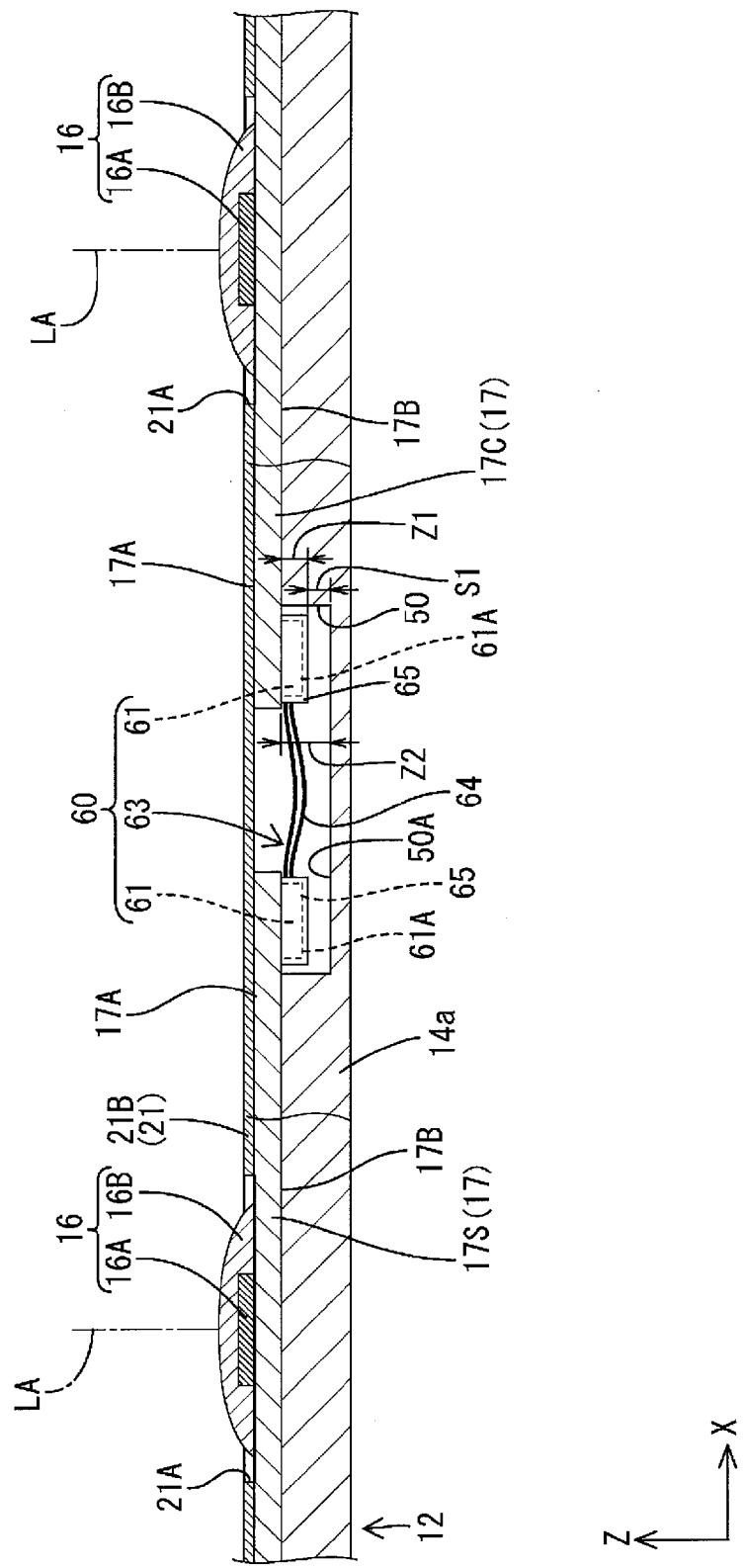
FIG. 6 is a cross-sectional view taken along the line B-B of FIG. 5.

The LEDs 16 are of the so-called surface mount type, and are mounted on a surface (surface having light sources mounted thereon, referred to as a light source mounted surface 17A) on the front side of each of the LED boards 17. An optical axis LA of each of the LEDs 16 is coaxial with the Z-axis. Additionally, the LEDs 16 are linearly arranged in the direction along the long sides (X-axis direction) of the LED board 17. The arrangement pitch of the LEDs 16 is approximately constant, and, in other words, the LEDs 16 are arranged at uniform intervals on the LED board 17. Each of the LEDs 16 includes a single-color LED chip 16A that emits only blue light, and a sealing portion 16B configured to seal the LED chip 16A, as shown in FIG. 6. The sealing portion 16B has a flat hemispheric shape and is formed of, for example, an optically transparent material such as epoxy resin. Additionally, a fluorescent material which glows when receiving light emitted from the LED chip 16A is mixed in the sealing portion 16B. As examples of this fluorescent material, a fluorescent material having a light emission peak in the yellow region, and a fluorescent material having light emission peaks in the green and red regions can be given. This configuration enables the LEDs 16 to emit white light.

Figure 5:
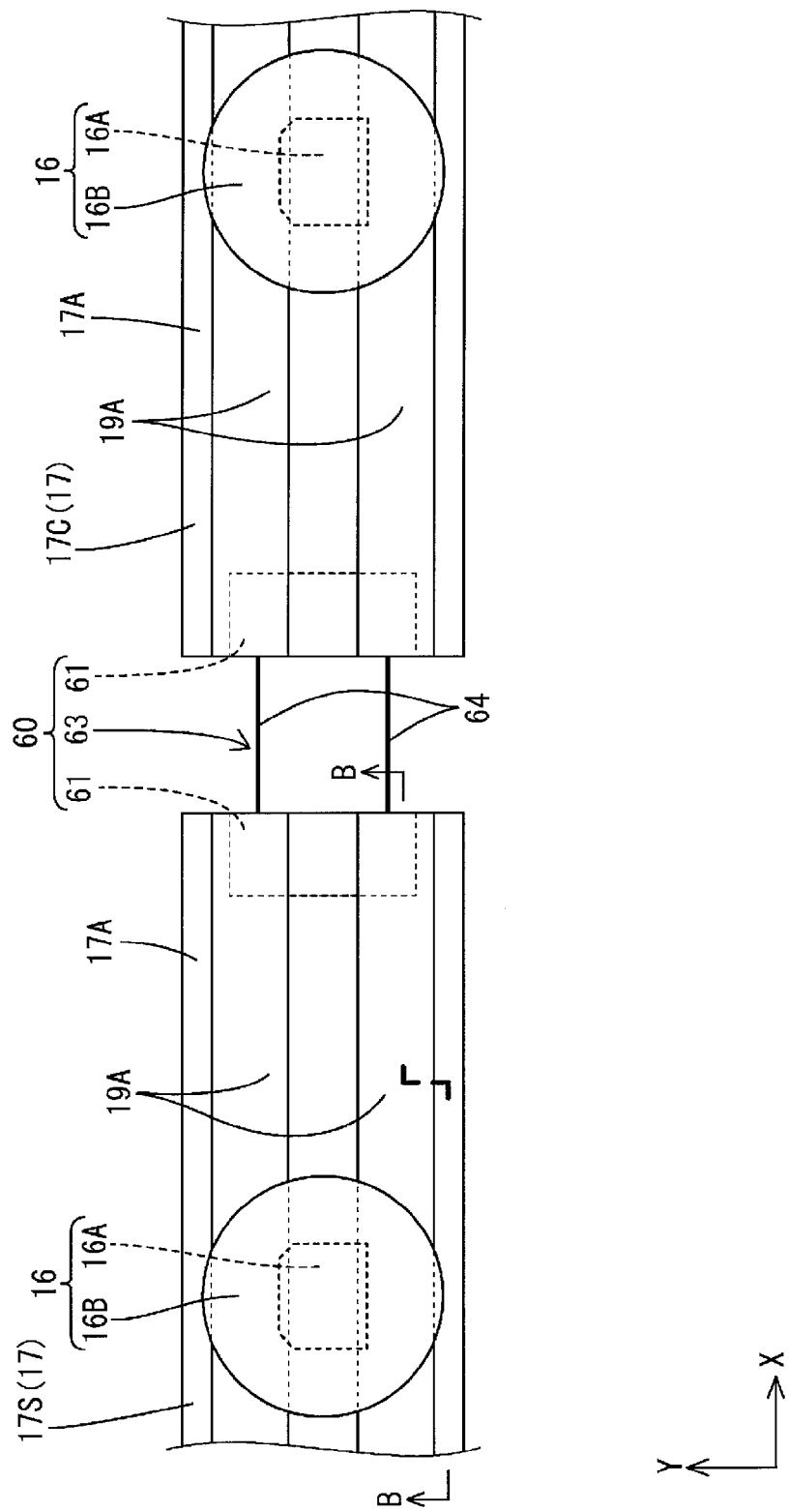
FIG. 5 is a plan view showing a structure for coupling mutually adjacent boards together.
Figure 7:
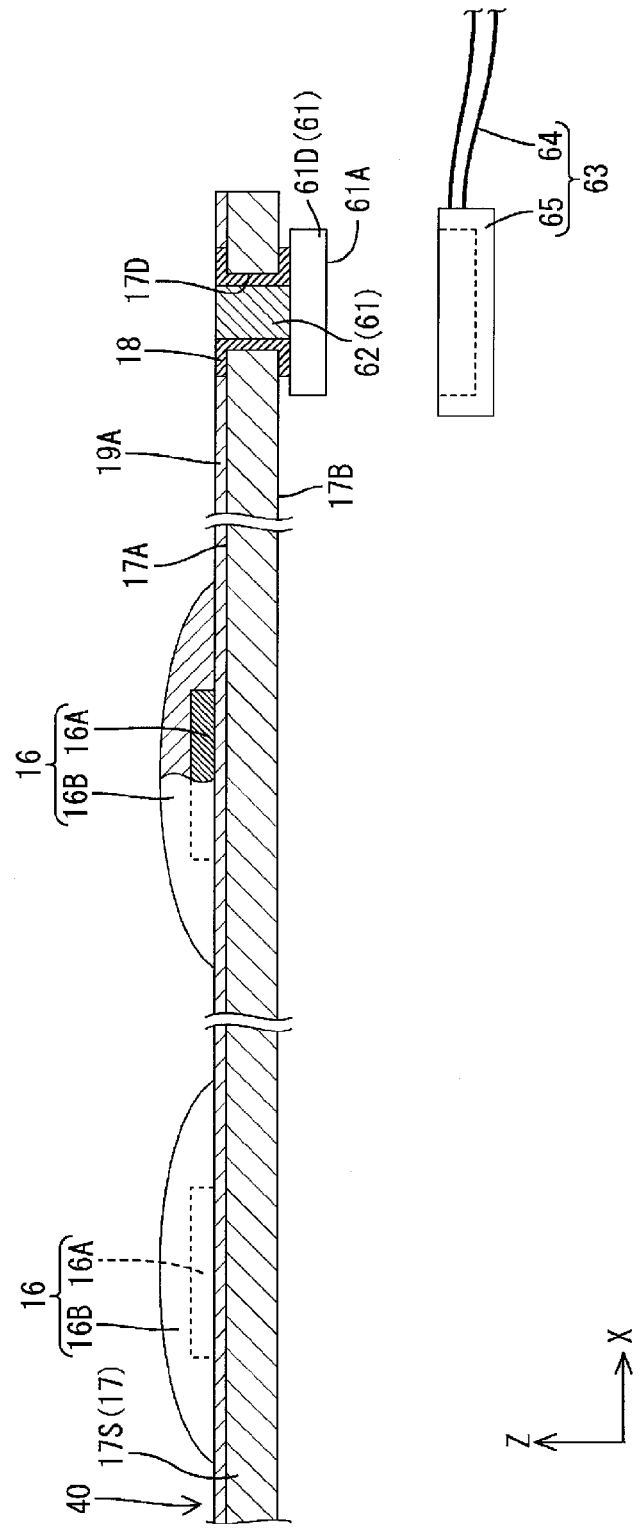
FIG. 7 is a cross-sectional view showing an electrical connection between an LED and a connector.

The LED board 17 is made of, for example, metal such as an aluminum-based material, and has an elongated shape extending in the direction along the long sides (X-axis direction) of the chassis 14. As shown in FIGS. 5 and 7, wiring patterns 19A formed of, for example, copper foil are formed on the light source mounted surface 17A of the LED board 17. Each of the wiring patterns 19A extends to the direction along the long sides of the LED board 17 such that two lines thereof run in parallel to each other. Each of the wiring patterns 19A is soldered to and thereby electrically connected to leads (corresponding to an anode and a cathode) not illustrated which are provided in the respective LED chips 16A described above. In each of the LED boards 17 lined up in the X-axis direction, the LED boards 17 that are adjacent to each other are electrically connected to each other via a connecting component 60. This connecting component 60 will be described in detail later. Note that, between the wiring pattern 19A and the LED board 17, an insulating layer is formed, whereby the wiring pattern 19A is electrically insulated from the LED board 17. In addition, an insulating layer is formed also on the front surface of the wiring pattern 19A. Note that the wiring pattern 19A is illustrated only in FIGS. 5 and 7, and that illustration of the respective insulating layers is omitted.

Next, a structure for attaching the LED board 17 to the chassis 14 will be described. As shown in FIG. 4, attachment holes 17a are formed at predetermined positions of the LED board 17 so as to penetrate the LED board 17 in the front-back direction (Z-axis direction). A clip 23 used for fixing the LED board 17 to the chassis 14 is inserted through each of the attachment holes 17a.

In the chassis 14, attachment holes 14e having the same diameters as the attachment holes 17a are formed at positions corresponding to the attachment hole 17a. The clip 23 is made of, for example, synthetic resin. As shown in FIG. 4, the clip 23 includes an attachment plate 23a running in parallel with the LED board 17 and having a circular shape in a plan view, and an insertion portion 23b projecting from the attachment plate 23a toward the chassis 14 along the Z-axis direction.

While the base end side of the insertion portion 23b has a diameter set slightly smaller than that of the attachment hole 17a, the top end side thereof has a diameter set larger than that of the attachment hole 17a. Additionally, a groove portion 23d having a shape dented toward the front side is formed in the top end portion of the insertion portion 23b. Thus, the top end portion of the insertion portion 23b is made elastically deformable. According to the above configuration, the top end side of the insertion portion 23b is fastened from the back side of the chassis 14 when the insertion portion 23b of the clip 23 is inserted through the attachment hole 17a and the attachment hole 14e. Thus, the LED board 17 is pinched by the attachment plates 23a of the clip 23 and the chassis 14, whereby a structure having the LED board 17 attached to the chassis 14 is formed. More precisely, while a bottom portion 21B of the reflection sheet 21 is arranged between the attachment plate 23a of the clip 23 and the LED board 17, the LED board 17 is pressed against the attachment plate 23a via the bottom portion 21B of the reflection sheet 21 from the front side.

Further, as shown in FIGS. 3 and 4, a substantially circular conic support pin 27 is provided on the front surface so as to project from the surface of the clips 23 arranged relatively close to the center of the chassis 14. The projecting height of the support pins 27 is set to a height that allows the top end thereof to abut (or approximate) the back side surface of the diffuser 15a. Thus, the support pins 27 carry the function of supporting the diffuser 15a from the back side thereof and thereby suppressing bending of the diffuser 15a.

Next, the reflection sheet 21 will be described. The reflection sheet 21 is, for example, made of synthetic resin, and the surface thereof is set in a white color which has excellent reflectivity. The reflection sheet 21 is laid down on the inner surfaces of the bottom plate 14a and the side plates 14b of the chassis 14 so as to cover most of these inner surfaces. This reflection sheet 21 enables reflection, toward the diffuser 15a, of some of light (for example, such as light from the LEDs 16 that does not go directly to the diffuser 15a, and light that is reflected by the diffuser 15a) emitted from the LEDs 16 of the light source units 40, and therefore, can increase the brightness of the backlight unit 12. The reflection sheet 21 includes: the bottom portion 21B arranged along the planar directions (the X-axis and Y-axis directions) of the chassis 14; and a sloped portion 21D spreading from marginal portion of and bottom 21B. The sloped portion 21D slopes toward the bottom plate 14a of the chassis 14 so as to approach the center of the liquid crystal display device 10. In addition, the marginal portions of the sloped portion 21D are supported by the respective receiving plates 14d of the chassis 14 as shown in FIG. 4.

As shown in FIG. 6, the bottom portion 21B of the reflection sheet 21 is placed over the light source mounted surface 17A of the LED board 17. Additionally, in the bottom portion 21B, light source through holes 21A configured to pass the LEDs 16 therethrough are formed at positions corresponding to the LEDs 16. Each of the light source through holes 21A has a circular shape in a plan view, and the outer diameter thereof is set larger than the outer diameter of each of the LEDs 16 (more precisely, the sealing portions 16B). Thus, the LEDs 16 can penetrate the light source through hole 21A and project on the front side of the reflection sheet 21, whereby a structure which enables light from the LEDs 16 to be emitted toward the diffuser 15a without being blocked by the reflection sheet 21 is formed. Additionally, interference between the reflection sheet 21 and the LEDs 16 is prevented by having the LEDs 16 penetrating the light source through holes 21A. Further, for example, even when an error in size or formation position has occurred, the error is allowed because the outer diameter of the light source through hole 21A is larger than the outer diameter of the LED 16 as described above. Therefore, the LED 16 can be inserted through the light source through hole 21A. Note that the outer diameter of the light source through hole 21A may be almost equal to the outer diameter of the LED 16. Also, a clip insertion hole 21E through which the insertion portion 23b of the above-described clip 23 can be inserted is formed in the bottom portion 21B of the reflection sheet 21.

The diffuser 15a is configured to have a structure in which a great number of diffusing particles is provided by being dispersed inside a base substrate having a predetermined thickness and made of transparent resin. The diffuser 15a has the function of diffusing light penetrating the diffuser 15a. The board thickness of the optical sheet 15b is set thinner than that of the diffuser 15a. As the optical sheet 15b, any one of a diffuser sheet, a diffuser lens sheet, a reflection type polarizing sheet and the like is used, and can be selected as appropriate.

The marginal portion of the diffuser 15a is placed over the marginal portion of the reflection sheet 21. Additionally, a frame 20 is placed on the receiving plates 14d in the chassis 14 from the front side, and is screwed and fixed thereto. A protrusion 20a that protrudes to the inner side of the chassis 14 is formed, which brings a structure where the protrusion 20a presses the marginal portion of the optical sheet 15b from the front side. Due to the above configuration, the reflection sheet 21, the diffuser 15a and the optical sheet 15b are pinched by the receiving plates 14d of the chassis 14 and the protrusion 20a of the frame 20. Further, the marginal portion of the liquid crystal panel 11 is placed on the front side of the frame 20, which enables the liquid crystal panel 11 to be pinched between the frame 20 and the bezel 13 which is arranged on the front side.

Next, the connecting component 60 which electrically connects the mutually adjacent LED boards 17 to each other among the LED boards 17 that form a line in the X-axis direction will be described. As shown in FIGS. 5 and 6, the connecting component 60 includes; a board mounted connector 61 mounted on each of the LED boards 17; and a relay component 63 which electrically connects the board mounted connectors 61.

The board mounted connector 61 is rectangular in a plan view, and two of the board mounted connectors 61 are mounted at both ends of each of the LED boards 17 in the direction of the long sides(refer to FIG. 3). The board mounted connector 61 includes a housing 61D made of synthetic resin having an insulating property, and a metallic terminal fitting 62 held by the housing 61D (FIG. 7). In addition, the board mounted connector 61 is mounted on a surface (hereinafter, referred to as a connecting component attached surface 17B) opposite to the light source mounted surface 17A. In other words, the LED board 17 is formed as a so-called double-sided mount board which has components (the LEDs 16 and the board mounted connectors 61) to be mounted are mounted on both sides.

Due to the arrangement of the board mounted connectors 61 on the connecting component attached surface 17B, the light source mounted surface 17A does not have the connecting components 60 but has only the LEDs 16 mounted thereon. Thus, the light source mounted surface 17A has a surface that is flat for the most part, except locations on which the LEDs 16 are mounted. When this configuration obtained by arranging the board mounted connectors 61 (the connecting components 60 as a result) on the connecting component attached surface 17B side and the above described configuration obtained by forming the light source through holes 21A in the reflection sheet 21 are adopted in combination, the reflection sheet 21 can be laid down along the planer directions (the X-axis and Y-axis directions) on the light source mounted surface 17A without any bending therein.

Next, a structure for electrical connection between the board mounted connector 61 and the LEDs 16 will be described. As shown in FIG. 7, a through hole 17D is formed in the LED board 17 so as to penetrate, in the front-back direction, apart on which the board mounted connector 61 is mounted. The inner circumferential surface of this through hole 17D is coated with a plating 18 (for example, copper plating). Apart of the terminal fitting 62 projecting from the housing 61D, out of the elements of the board mounted connector 61, is inserted into the through hole 17D, and is soldered to and thereby electrically connected to the plating 18. Additionally, as shown in FIG. 5, the board mounted connector 61 is set in a length that allows the board mounted connector 61 to straddle the two lines of the wiring pattern 19A in the Y-axis direction. Due to the above configuration, the board mounted connector 61 and the wiring pattern 19A are electrically connected to each other through the plating 18, whereby a configuration in which the board mounted connector 61 and each of the LED chips 16A are electrically connected to each other is obtained. The board mounted connector 61 is arranged on the LED board 17 with a fitting face 61A thereof, through which the board mounted connector 61 is fitted with a relay connector 65 to be described below, facing toward the back side (toward the bottom plate 14a of the chassis 14). Note that, in FIG. 7, the reflection sheet 21 is omitted.

As shown in FIG. 6, the relay component 63 includes: electric wires 64 each obtained by, for example, coating a conducting wire with a flexible coating material such as polyvinyl chloride, the conducting wire being made of a metallic material such as copper; and the rely connectors 65 each connected to both ends of the electric wires 64. The board mounted connector 61 and each of the relay connectors 65 are configured to be fitted with each other, whereby, when the respective board mounted connectors 61 are fitted into corresponding ones of the relay connectors 65, a configuration is obtained in which each of the LED chips 16A mounted on mutually adjacent ones of the LED boards 17 are electrically connected to one another through the relay components 63.

Note that, as shown in FIG. 3, each of the two endmost ones (first light source boards indicated by reference numeral 17S) out of the three LED boards 17 lined up in the X-axis direction is configured to be adjacent to another one (a second light source board indicated by reference numeral 17C) of the LED boards 17 only in one side facing the central one of the three LED boards 17. In each of these endmost LED boards 17S, a drive control circuit not illustrated is connected to the board mounted connector 61 (indicated by reference numeral 61B in FIG. 3) arranged in the end side (one side in which the LED board 17S is not adjacent to the LED board 17C) thereof. Thus, power necessary for lighting the LEDs 16 lined up side by side in the X-axis direction is supplied through the wiring patterns 19A from the drive control circuits. Also, drive control of the LEDs 16 lined up side by side in the X-axis direction can be performed collectively.

As shown in FIG. 6, on the inner surface of the bottom plate 14a (bottom portion) of the chassis 14, a part that faces the connecting components 60 is dented, and a housing portion 50 configured to house the connecting component 60 is thereby formed. As a result, while the configuration in which the connecting component 60 is arranged on the connecting component attached surface 17B (a surface facing the bottom plate 14a of the chassis 14) of the LED board 17 is employed, the LED board 17 can be installed in the bottom plate 14a without causing interference between the connecting component 60 and the bottom plate 14a.

Also, in the Z-axis direction, a size Z2 of the depth of the housing portion 50 is set larger than a size Z1 of the projection of the connecting component 60 from the LED boards 17. A space S1 is thereby formed between a bottom face 50A of the housing portion 50 and a position at which the projection of the connecting component 60 (the relay connectors 65) ends. Even when an external force acts on the chassis 14, the connecting component 60 can be protected since the thus formed space S1 is configured to suppress direct transmission of such an external force from the bottom plate 14a to the connecting component 60. Additionally, even when some errors have occurred in sizes of the housing portion 50 and the connecting component 60, interference between the connecting component 60 and the bottom plate 14a can be more reliably prevented since the thus formed space S1 is configured to absorb such errors in sizes.

The present embodiment is configured as described above, and operations thereof will be described next. First, a procedure for installing the LED boards 17 and the reflection sheet 21 on the chassis 14 will be described. At the beginning, before the LED boards 17 are attached to the chassis 14, the respective board mounted connectors 61 mounted on mutually adjacent two of the LED boards 17 are fitted into the relay connectors 65 of the relay component 63, so that these two LED boards 17 are electrically connected to each other via the relay component 63. Then, each of the LED boards 17 (light source unit 40) is installed on the bottom plate 14a. At this installation, when the connecting component 60 is housed in the housing portion 50, the space S1 is secured between each of the relay connectors 65 and the bottom face 50A of the housing portion 50, enabling avoidance of interference between the connecting component 60 and the bottom plate 14a.

Then, the reflection sheet 21 is laid down on the inner surface of the chassis 14. Specifically, the reflection sheet 21 is housed in the chassis 14 while the respective light source through holes 21A thereof are aligned with the corresponding LEDs 16. Consequently, while the respective LEDs 16 are passed through the corresponding light source through holes 21A, the bottom portion 21B of the reflection sheet 21 is laid on the light source mounted surfaces 17A of the respective LED boards 17. In the present embodiment, each of the light source mounted surfaces 17A has a surface that is flat for the most part because there are no portions thereon projecting frontward other than the parts where the LEDs 16 are mounted. Therefore, the bottom portion 21B of the reflection sheet 21 is laid without any bending therein, along the planer directions (the X-axis and Y-axis directions) on the light source mounted surfaces 17A (refer to FIG. 6). In other words, the reflection sheet 21 is placed over the light source mounted surfaces 17A while maintaining a high degree of flatness. Additionally, the marginal portion of the reflection sheet 21 is placed on the receiving plates 14d of the chassis 14 at the same time as the above work. After the reflection sheet 21 is laid, the insertion portion 23b of each of the clips 23 is inserted in order through the clip insertion hole 21E of the reflection sheet 21, the attachment hole 17a of the LED board 17, and the attachment hole 14e of the chassis 14. Both of the bottom portion 21B of the reflection sheet 21 and the LED board 17 are thereby pinched between the attachment plate 23a of the clip 23 and the bottom plate 14a of the chassis 14 (refer to FIG. 4). Installation of the LED boards 17 and the reflection sheet 21 to the chassis 14 is completed in the above procedure.

Next, operations when LEDs 16 are driven will be described. The LED chips 16A on each of the LED boards 17 are electrically connected to one another through the wiring pattern 19A, and the LED boards 17 lined up in the X-axis direction are electrically connected to one another through the connecting components 60. Therefore, the drive control circuit can be used to collectively drive the LEDs 16 lined up in the X-axis direction. The LEDs 16 are lit up when driving power is supplied to these LEDs 16 from the drive control circuit. A predetermined image is displayed on a display surface of the liquid crystal panel 11 by supplying image signals to the liquid crystal panel 11 at the same time as this lighting of the LEDs 16. Some of light emitted when the LEDs 16 are lit is reflected toward the diffuser 15a by the reflection sheet 21. Unevenness is less likely to be generated in the light reflected by the reflection sheet 21 because, as described above, the reflection sheet 21 is laid without any bending therein along the planer directions (the X-axis and Y-axis directions) while maintaining a high level of flatness.

Figure 8:
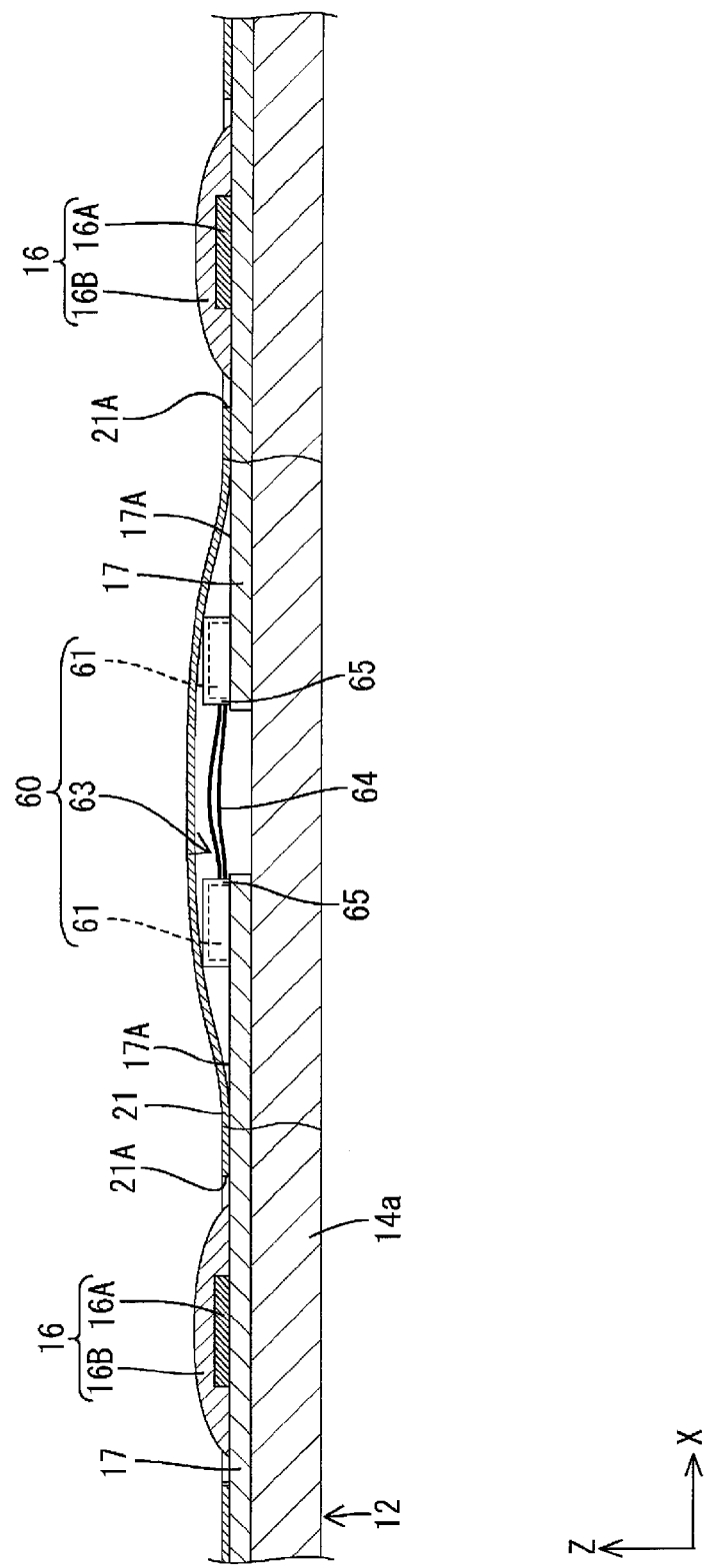
FIG. 8 is a cross-sectional view showing a comparative example of an LED board.

A comparative example of a case when some bend has occurred in the reflection sheet 21 will be described with reference to FIG. 8. As shown in FIG. 8, in a case where a configuration having the connecting components 60 mounted on the light source mounted surfaces 17A, the reflection sheet 21 rides on the connecting components 60 and thereby bends. When bending has occurred in the reflection sheet 21, unevenness is generated in the light reflected by the reflection sheet 21, whereby uneven brightness may occur in outgoing light emitted from the backlight unit 12.
In that respect, the present embodiment makes it possible to prevent such uneven brightness, and consequently, makes it possible to provide a favorable display quality to the liquid crystal display device 10 or the television receiver TV.

As described above, the backlight unit 12 according to the present embodiment is configured such that, in each of the LED boards 17, the connecting component 60 is arranged on a surface (connecting component attached surface 17B) opposite to the light source mounted surfaces 17A over which the reflection sheet 21 is placed. The configuration of the present embodiment enables avoidance of interference between the connecting component 60 and the reflection sheet 21. As a result, bending of the reflection sheet 21 can be suppressed, whereby uneven brightness attributable to the bending can be suppressed. Note that, in order to avoid interference between the reflection sheet 21 and each of the connecting components 60, also conceivable is a configuration in which: through holes are formed at locations in the reflection sheet 21 that correspond to the connecting components 60; and the reflection sheet 21 is arranged while the connecting components 60 being passed through these through holes. However, formation of such through holes in the reflection sheet 21 results in changes in light reflectivity at the locations in which the through holes are formed, whereby uneven brightness may be caused. In this regard, the configuration of the present embodiment does not require formation of through holes used for inserting connecting components, and therefore eliminates the possibility of generating uneven brightness, thereby being favorable.

Additionally, each of the connecting components 60 includes the board mounted connectors 61 and the relay component 63. This structure provides excellent workability because electric connection between the LED boards 17 can be established by attaching the relay component 63 to the board mounted connectors 61. Particularly, the highly flexible electric wires 64 included in the relay component 63 further facilitate the work of connecting the relay component 63 to the board mounted connectors 61.

Further, in the reflection sheet 21, the light source through holes 21A configured to pass the LEDs 16 therethrough are formed in locations corresponding to the respective LEDs 16 in a plan view. This makes it possible to place the reflection sheet 21 over the light source mounted surfaces 17A without causing interference thereof with the LEDs 16. Combination of this configuration and the above described configuration in which the connecting components 60 are arranged on the connecting component attached surface 17B makes it possible to more reliably suppress bending of the reflection sheet 21.

<Second Embodiment>

Figure 9:
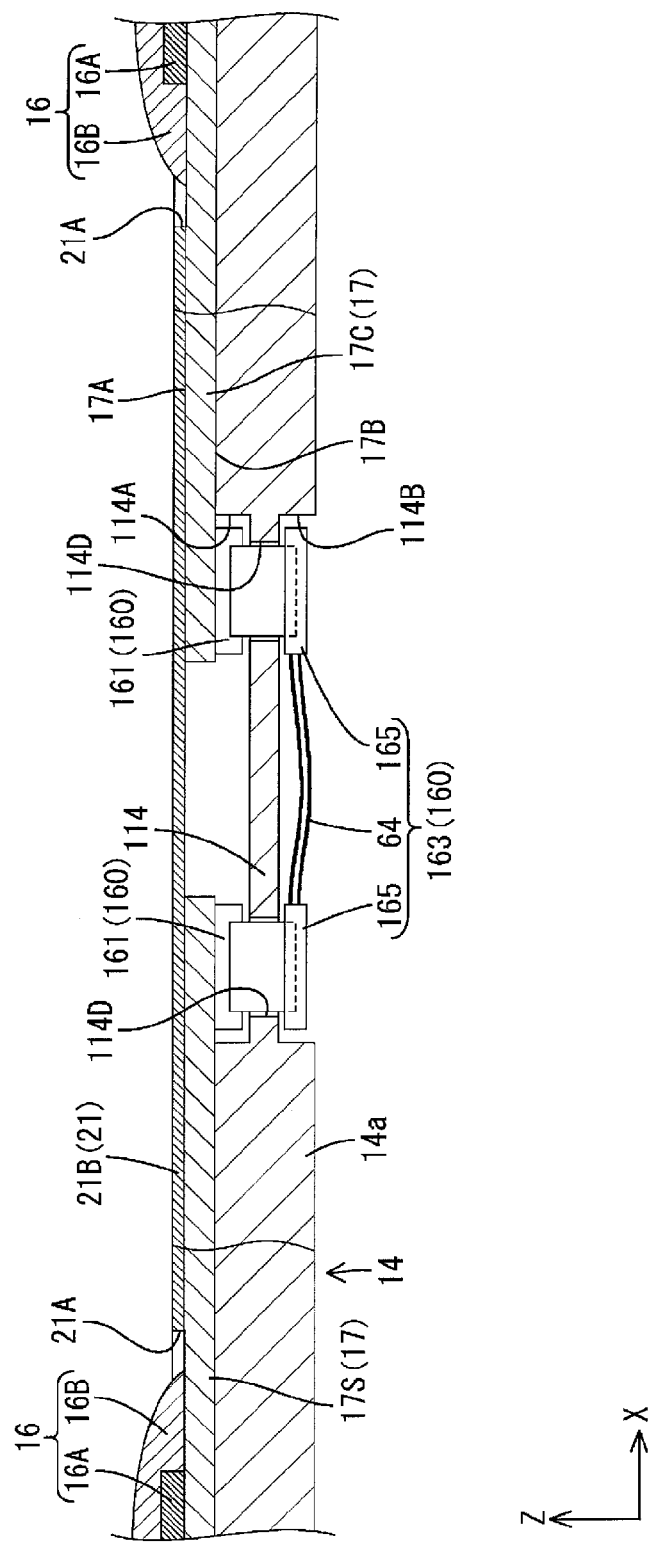
FIG. 9 is a cross-sectional view showing a structure for coupling boards together according to a second embodiment of the present invention.

Next, a Second embodiment of the present invention will be described with reference to FIGS. 9, 10 and 20. In the second embodiment described herein, a structure for attachment between a board mounted connector and a relay component are different from that of the first embodiment. Note that, in the second embodiment described herein, the same reference symbols are used for parts having the same names as those in the first embodiment described above, and redundant explanations on structures, operations and effects are omitted.

The present embodiment employs a configuration which makes it possible to attach a relay component 163 to a board mounted connector 161 from the outside of the bottom plate 14a of the chassis 14. Specific configurations will be described below. On the inner (front) surface of the bottom plate 14a of the chassis 14, parts corresponding to the board mounted connectors 161 are dented toward the back side, whereby connector housing portions 114A are formed. Additionally, on the outer (back) surface in the bottom plate 14a of the chassis 14, parts corresponding to the connector housing portion 114A are dented toward the front, whereby relay component housing portions 114B which can house the relay components 163 are formed. In other words, in the bottom plate 14a, parts facing the connecting components 160 are formed into thin portions 114 having a thickness set smaller than the other parts.

Figure 10:
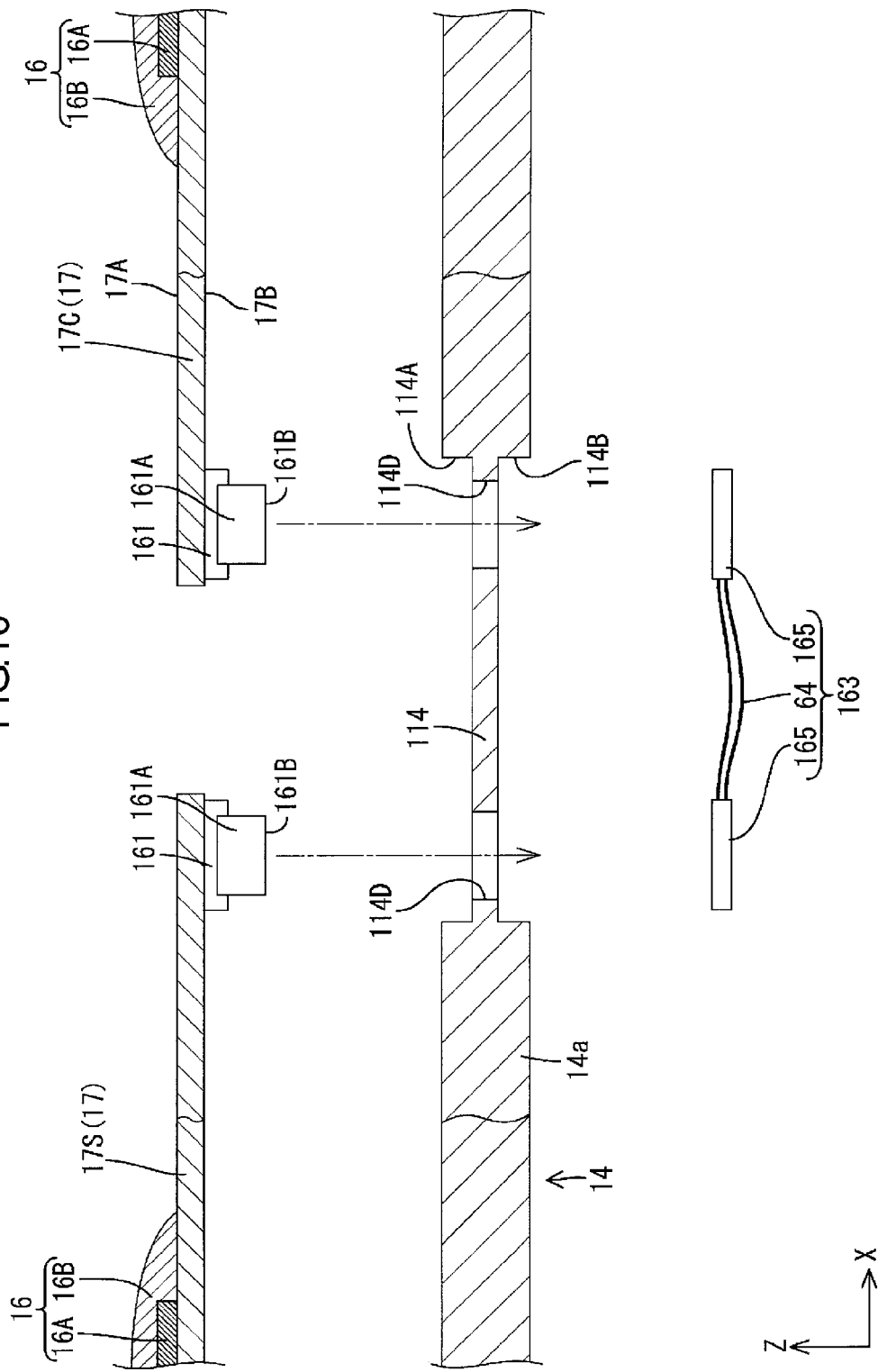
FIG. 10 is an exploded view showing respective components in FIG. 9 in a disassembled state.

As shown in FIG. 10, in each of the thin portions 114, insertion holes 114D penetrating from the front to the back are formed in parts facing the board mounted connectors 161, which top end portions 161A (parts of the connectors) of the respective board mounted connectors 161 are allowed to be inserted into these insertion holes 114D.

Figure 20:
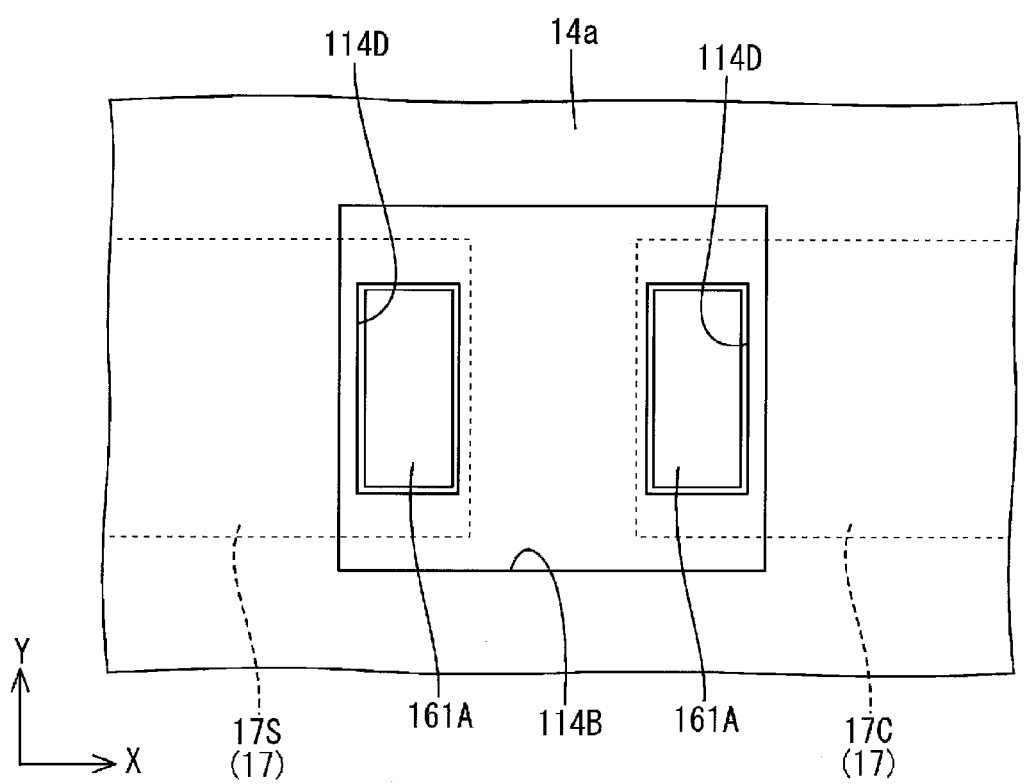
FIG. 20 is a plan view, from the back side, of a chassis having a quadrangular through hole formed therein.

As shown in FIG. 20, each of the insertion holes 114D has a quadrangular shape larger than a shape (square shape) of each of the top end portions 161A in a plan view. Note that, in a plan view, the shape of insertion hole 114D may be substantially the same as that of the top end portion 161A. Further, the insertion hole 114D may be formed in a size that allows insertion of not only the top end portion 161A of the board mounted connector 161 but also the board mounted connector 161 as a whole into the insertion hole 114D.

Electrical connection between adjacent ones of the LED boards 17 is established in the above configuration in the following procedure. First, the LED boards 17 are placed on the chassis 14. At this time, the top end portions 161A of the board mounted connectors 161 are inserted into the insertion holes 114D (arrows in FIG. 10). The top end portions 161A are thereby arranged so as to project over the back side of the thin portion 114, and fitting faces 161B of the respective board mounted connectors 161 are thereby arranged toward the back side of the chassis 14. Additionally, the LED board 17 is positioned with respect to the planar directions (the X-axis and Y-axis directions) by having the top end portions 161A inserted into the insertion holes 114D. Subsequently, the LED board 17 is fixed by use of the clips 23. At this time, the work of fixing the LED board 17 by use of the clips 23 is easy because the LED board 17 has been positioned with respect to the planer directions (X-axis and Y-axis direction). After the LED board 17 is fixed to the chassis 14, relay connectors 165 of the relay component 163 are fitted with the respective top end portions 161A from the back side (the outside) of the chassis 14. The LED board 17s are thereby electrically connected to each other. Additionally, in a state where the relay component 163 is being fitted with the board mounted connectors 161, the relay component 163 is housed in the relay component housing portion 114B and is prevented from projecting over the outer surface of the bottom. plate 14a of the chassis 14.

The present embodiment employs the configuration which makes it possible to attach the relay components 163 to the board mounted connectors 161 from the outside of the chassis 14 due to the formation of the insertion holes 114D in the chassis 14. This configuration makes it possible both to employ a configuration in which the board mounted connectors 161 are mounted on the connecting component attached surfaces 17B (surfaces facing the bottom plate 14a of the chassis 14), and to attach the relay component 163 after the LED boards 17 have been attached to the chassis 14. Therefore, it is not necessary to connect the LED boards 17 with one another via the relay components 63 before attaching the LED boards 17 to the chassis 14 as in the case of the first embodiment (refer to FIG. 6). Therefore, the LED boards 17 can be individually attached to the chassis 14, whereby the handling (transportation) of the LED boards 17 is facilitated, which leads to improved workability.

Additionally, the relay component 163 is configured to be housed in the relay component housing portion 114B, and therefore does not project to the outside of the chassis 14. Thus, the relay components 163 can be protected.

<Third Embodiment>

Figure 11:
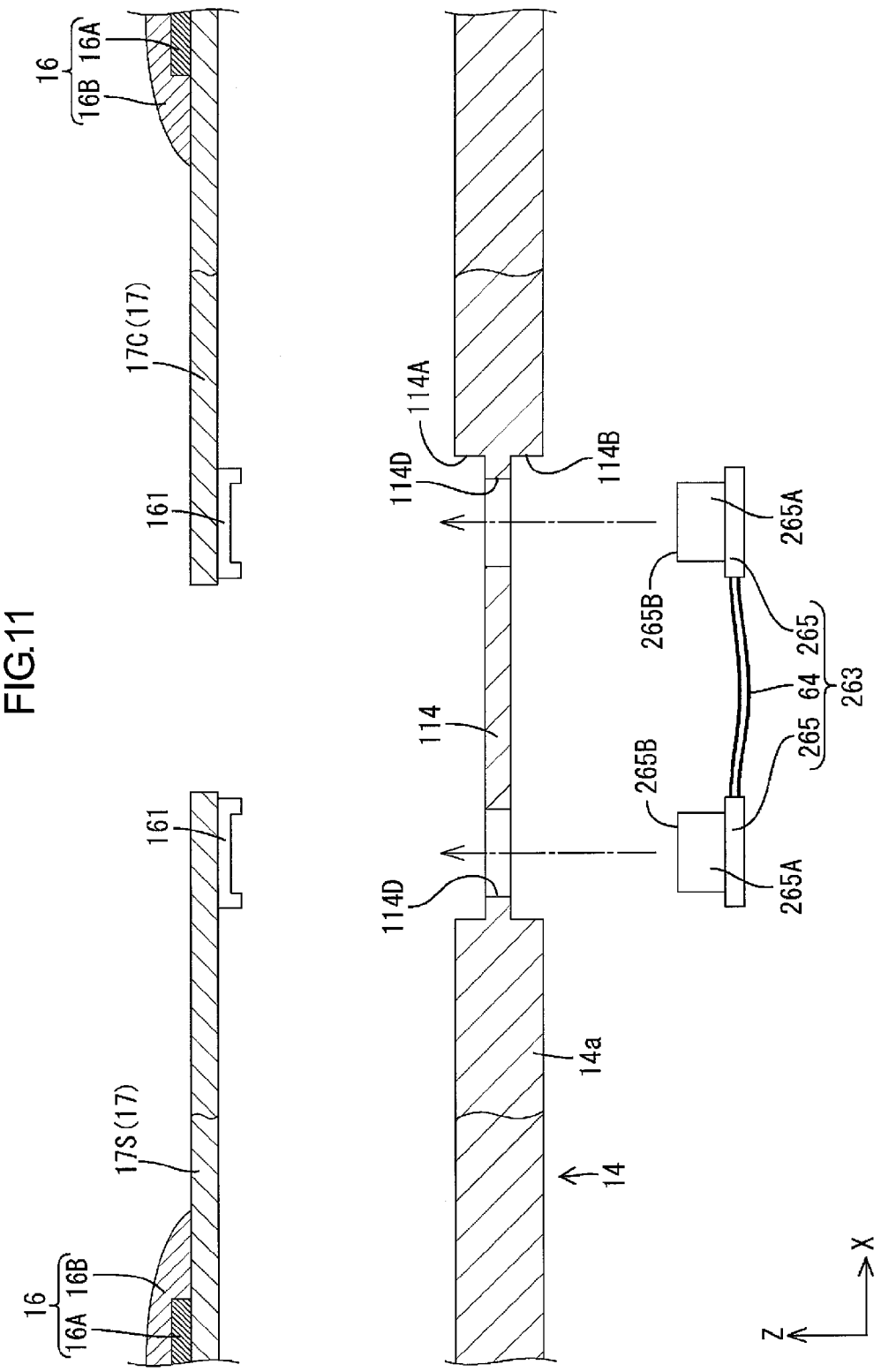
FIG. 11 is a cross-sectional view showing a structure for coupling boards together according to a third embodiment of the present invention.

Next, a third embodiment of the present invention will be described with reference to FIG. 11. Note that, in the third embodiment described herein, the same reference symbols are used for parts having the same names as those in the above described embodiments, and redundant explanations on structures, operations and effects are omitted.

In the second embodiment described above, the top end portions 161A of the board mounted connectors 161 are allowed to be inserted into the insertion holes 114D formed in the chassis 14. In contrast, the present embodiment employs a configuration in which, as shown in FIG. 11, top end portions 265A (parts of a relay component) projecting toward the front side are formed on the relay connector 265 and inserted into the insertion holes 114D. This configuration makes it possible to attach a relay component 263 to board mounted connectors 261 by inserting the top end portions 265A of the relay component 263 into the insertion holes 114D from the outside of the chassis 14 after attaching the LED boards 17 to the chassis 14. Also, in the configuration employed by the present embodiment, the board mounted connectors 261 do not project from the chassis 14 to the outside but are housed inside.

This configuration makes it possible to more reliably protect the board mounted connectors 261 even during the work of fixing the LED boards 17 to the chassis 14 by use of the clips 23.

<Fourth Embodiment>

Figure 12:
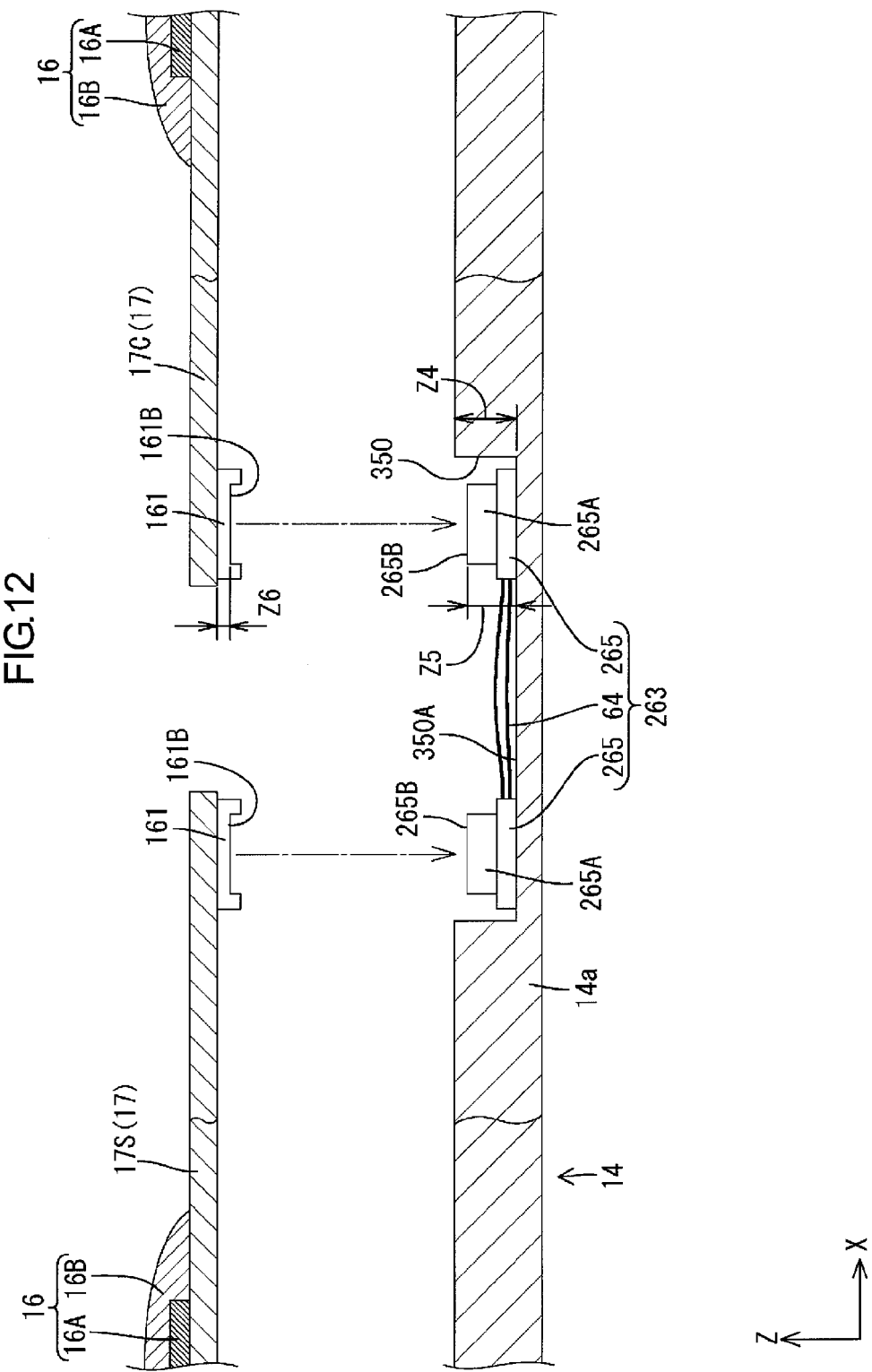
FIG. 12 is a cross-sectional view showing a structure for connecting boards according to a fourth embodiment of the present invention.

Next, a fourth embodiment of the present invention will be described with reference to FIG. 12. Note that, in the fourth embodiment described herein, the same reference symbols are used for parts having the same names as those in the above described embodiments, and redundant explanations on structures, operations and effects are omitted.

In the present embodiment, the relay component 263 is arranged on the bottom plate 14a of the chassis 14. Specifically, in the bottom plate 14a of the chassis 14, a part facing the board mounted connectors 161 is dented, whereby a connecting component housing portion 350 is formed. The relay connectors 265 are installed on a bottom face 350A of the connecting component housing portion 350. The relay connectors 265 housed in the connecting component housing portion 350 are supported by the bottom plate 14a from the back side. The fitting faces 265B of the respective relay connectors 265 are arranged so as to face the fitting faces 161B of the respective board mounted connectors 161. Additionally, in the Z-axis direction, a depth Z4 of the connecting component housing portion 350 is set substantially equal to a value (a value obtained by adding up a height Z5 and a height Z6 in FIG. 12) obtained by totaling the heights of the relay connector 265 and the board mounted connector 161 in a state where these two parts are fitted together. Due to such a configuration, attachment of the LED boards 17S and 17C to the chassis 14 causes each of the relay connectors 265 and a corresponding one of the board mounted connectors 161 to be fitted together. In other words, the workability is excellent since the work of attaching the LED boards 17 to the chassis 14 and the work of electrically connecting mutually adjacent ones of the LED boards 17 to each other are carried out at the same time.

<Fifth Embodiment>

Next, a fifth embodiment of the present invention will be described with reference to FIGS. 13 and 14. Note that, in the fifth embodiment described herein, the same reference symbols are used for parts having the same names as those in the above described embodiments, and redundant explanations on structures, operations and effects are omitted. Each of the above embodiments employs a configuration in which the LED boards 17 are connected to one another via relay components. In contrast, the present embodiment excludes relay components, and employs a configuration in which electrical connection between the LED boards 17 is established by directly fitting together the board mounted connectors 461L and 461R mounted on the light source mounted surfaces 17A of the LED boards 17. That is, only two components, which are the board mounted connector 461L and the board mounted connector 461R, constitute each connecting component. This makes it possible to reduce the number of components of the connecting component and thereby reduce the cost. Note that, in the following description, the LED board 17C and the LED board 17S are taken as an example of mutually adjacent ones of the LED boards 17.

Figure 13:
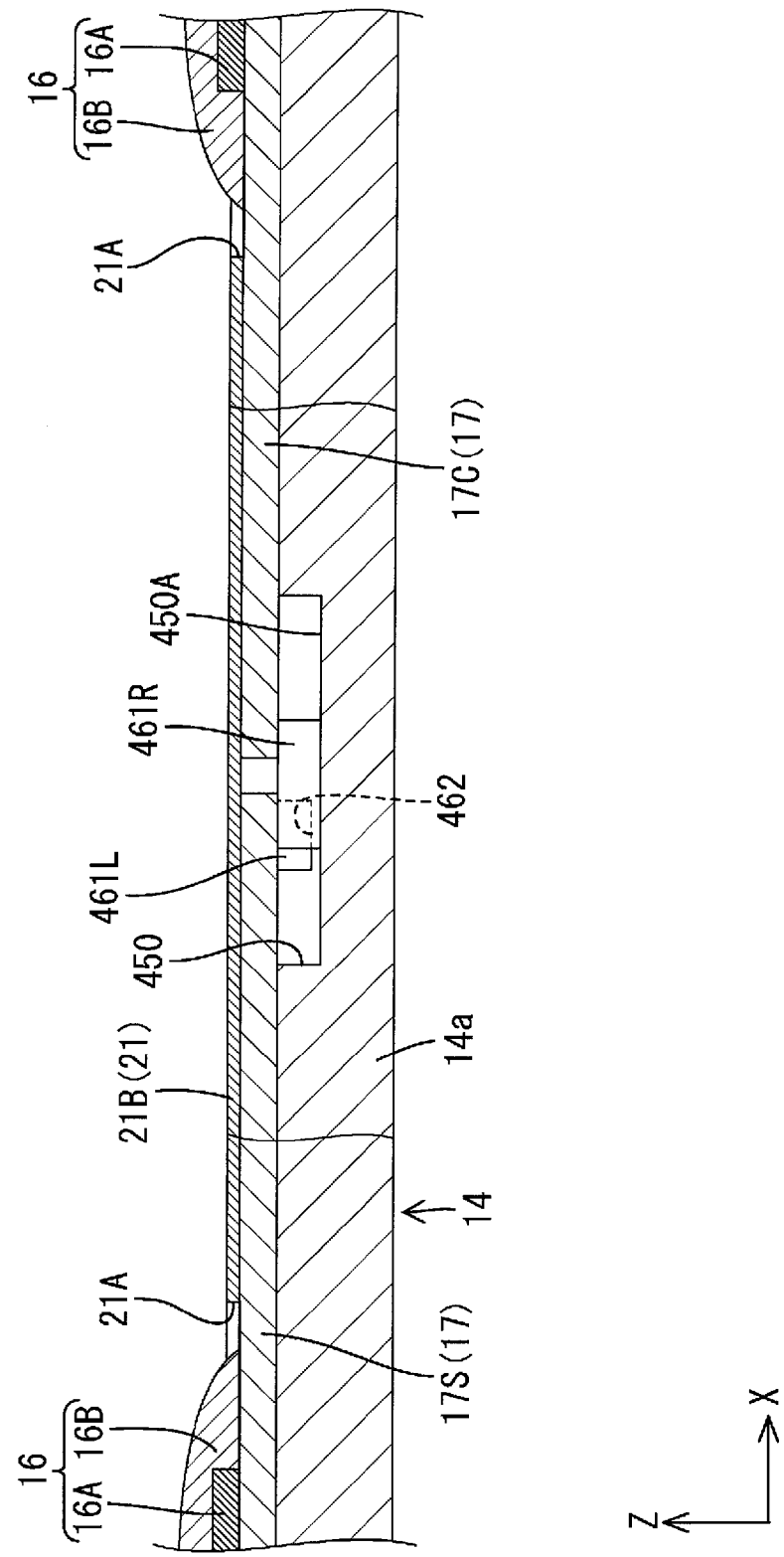
FIG. 13 is a cross-sectional view showing a structure for coupling boards together according to a fifth embodiment of the present invention to each other.
Figure 14:
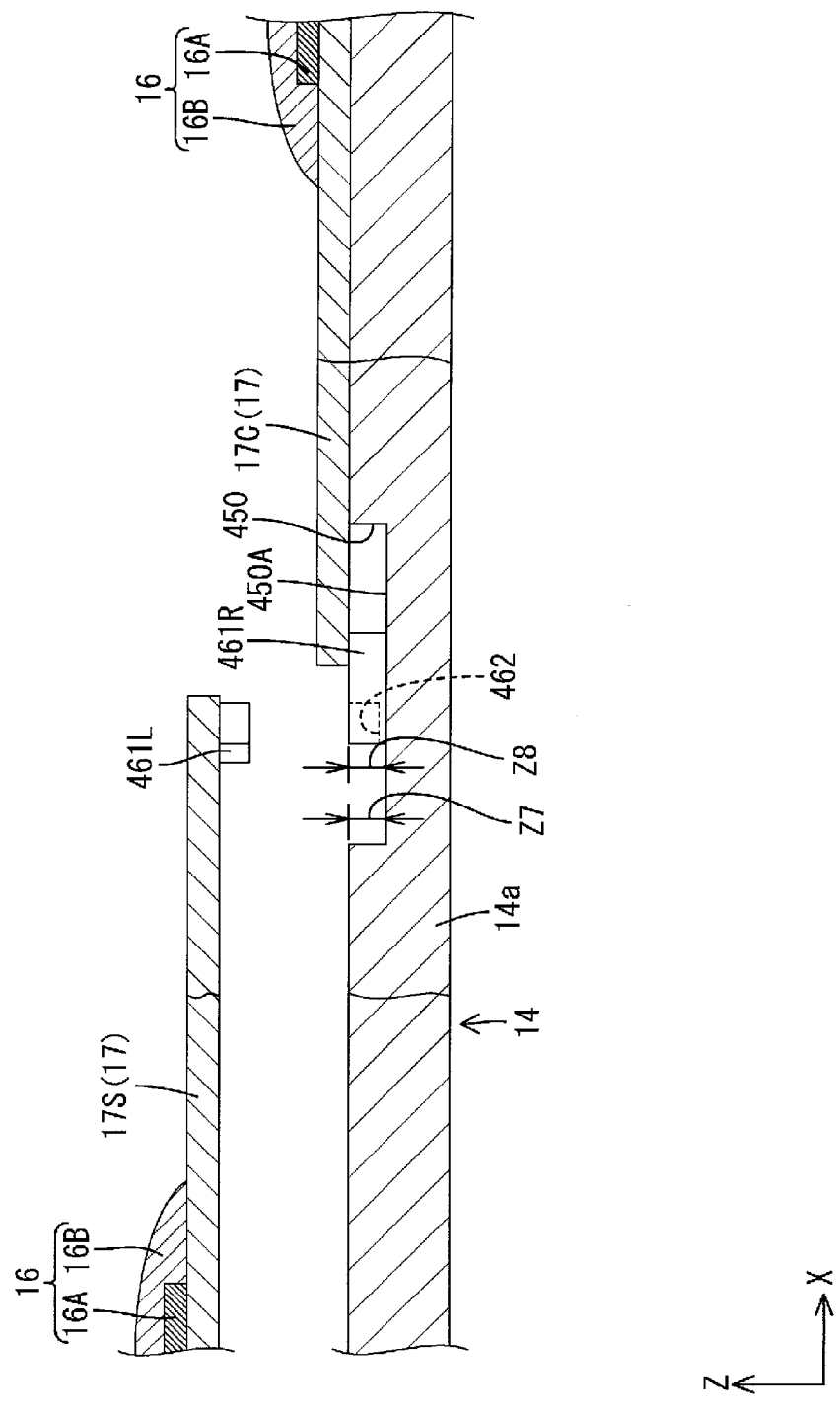
FIG. 14 is a cross-sectional view showing a procedure for coupling boards together.

As shown in FIG. 13, the board mounted connector 461R mounted on the LED board 17C is arranged such that the top end portion thereof projects toward the LED board 17S in the X-axis direction. A fitting portion 462 obtained as an L-shaped cutout is formed (illustrated with a dotted line) in the top end portion of the board mounted connector 461R so as to correspond to the shape of the board mounted connector 461L of the LED board 17S. Additionally, in the bottom plate 14a of the chassis 14, a part corresponding to the board mounted connectors 461L and 461R is dented, whereby a connecting component housing portion 450 which can house the board mounted connectors 461L and 461R. Note that, in the Z-axis direction, a depth Z7 of the connecting component housing portion 450 is set substantially equal to a height Z8 of the board mounted connector 461R. Consequently, a configuration is obtained in which, when the LED board 17C is attached to the chassis 14, the back surface of the board mounted connector 461R abuts and is supported by a bottom face 450A of the connecting component housing portion 450.

In the above configuration, an electrical connection between the LED board 17S and the LED board 17C is made in the following procedure. First, the LED board 17C is attached to the chassis 14. At this time, the board mounted connector 461R of the LED board 17C has the fitting portion 462 thereof facing to the front side, and is in a state ready for being fitted with the board mounted connector 461L. Next, the LED board 17S is attached to the chassis 14. With a movement of the LED board 17S when the LED board 17S is installed, the board mounted connector 461L is fitted into the fitting portion 462 of the board mounted connector 461R which is a receiving counterpart. The LED boards 17S and 17C are thereby electrically connected. Due to elimination of relay components as described above, connecters are fitted together at only one location in each of the connecting components, whereby the present embodiment provides better workability than the above embodiments each including relay components. Note that, when the board mounted connectors 461L and 461R are fitted together, the board mounted connector 461R is pressed toward the back side by the board mounted connector 461L. At this time, although a force working in a direction that tends to pull the board mounted connector 461R away from the LED board 17C acts due to the board mounted connector 461L, the present embodiment enables the bottom face 450A of the connecting component housing portion 450 to receive the above described force because the board mounted connector 461R is be supported by the bottom face 450A. A situation that the board mounted connector 461R is detached from the LED board 17C can be thereby avoided, whereby high connection reliability can be achieved.

<Sixth Embodiment>

Next, a sixth embodiment of the present invention will be described with reference to FIG. 15. Note that, in the sixth embodiment described herein, the same reference symbols are used for parts having the same names as those in the above described embodiments, and redundant explanations on structures, operations and effects are omitted. In each of the above embodiments, the wiring pattern 19A connected to the LED chips 16A is formed on the light source mounted surface 17A of each of the LED boards 17 as shown in FIG. 7. In contrast, the present embodiment employs a configuration in which a wiring pattern 519B (second wiring) connected to the LED chips 16A is formed on each connecting component attached surface 517B.

Figure 15:
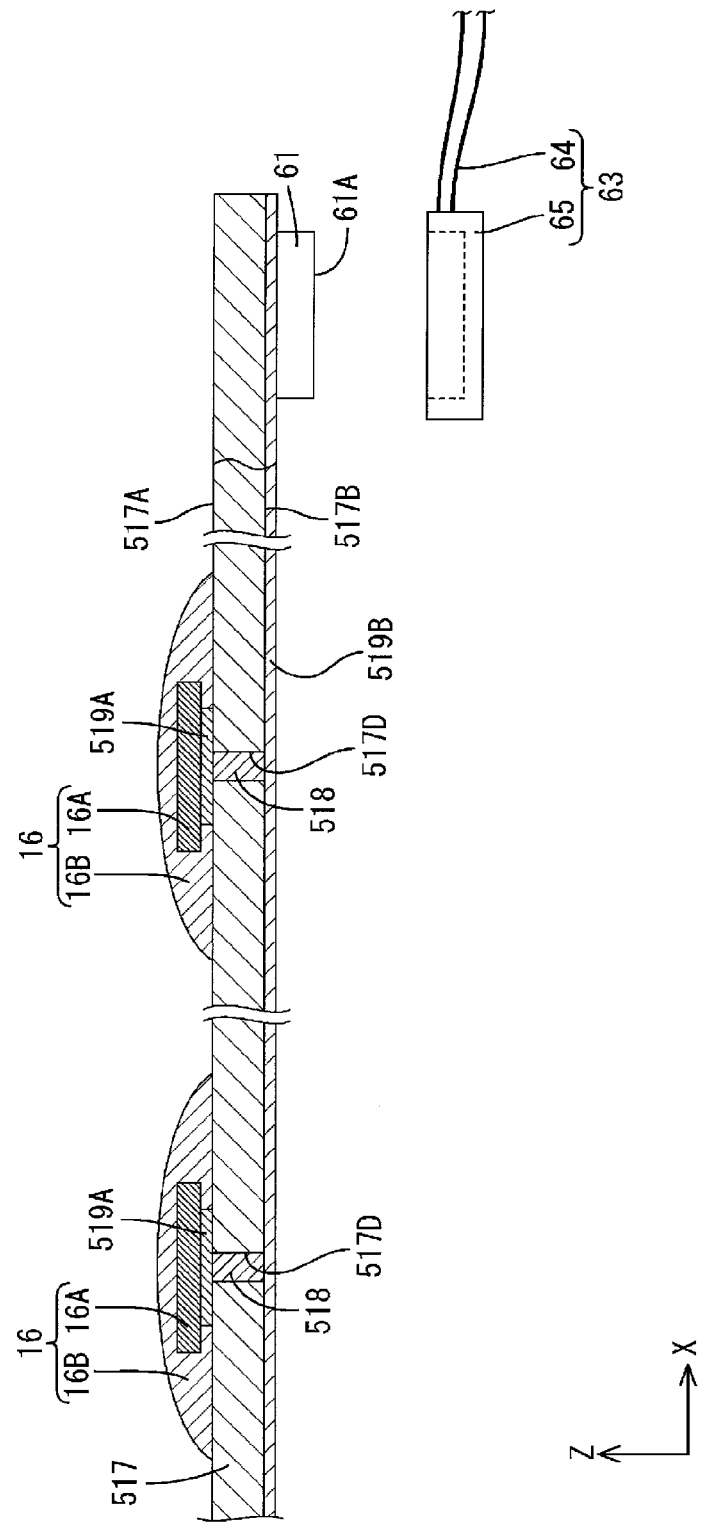
FIG. 15 is a cross-sectional view showing an electric connection, according to a sixth embodiment of the present invention, between an LED and a connector.

As shown in FIG. 15, on the light source mounted surface 517A, a wiring pattern 519A (first wiring) is formed in apart corresponding to each of the LED chips 16A with an insulating layer interposed therebetween. Each of the LED chips 16A and the wiring pattern 519A are electrically connected to each other, for example, by soldering. The wiring pattern 519B (second wiring) extends on the connecting component attached surface 517B in the X-axis direction with an insulating layer interposed therebetween, and is electrically connected, at the opposite ends thereof, to the respective board mounted connectors 61. Additionally, insulating layers are also formed on the back surfaces of the wiring patterns 519B, whereby the configuration here serves to electrically insulate the chassis 14 and each of the wiring patterns 519B from each other when the LED boards 17 are installed on the bottom plate 14a of chassis 14. Note that illustration of the insulating layers provided on the wiring patterns 519A and 519B is omitted.

In addition, through holes 517D penetrating the LED board 517 in the front-back direction are formed in the LED board 517 so as to correspond to locations at which the wiring patterns 519A are formed. For example, a conductive paste 518 (third wiring) is inserted into the through holes 517D. Through the conductive paste 518, each of the wiring pattern 519A and the wiring pattern 519B on the connecting component attached surface 517B are electrically connected to each other.

Due to the above configuration, the present embodiment is configured such that electrical connections are made from the LED chips 16A to the wiring patterns 519A, the conductive paste 518, the wiring patterns 519B and then to the board mounted connector 61. Note that the present embodiment may employ a configuration in which each of the wiring patterns 519A and the wiring pattern 519B are electrically connected to each other by plating the inner surface of a corresponding one of the through holes 517D (plated through holes), instead of using the conductive paste 518.

In the present embodiment, the wiring patterns 519A and 519B are formed on the two opposite surfaces (the light source mounted surface 517A and the connecting component attached surface 517B) of each of the LED boards 517. The amount of heat release from wiring patterns can be thereby increased as compared to a configuration in which wiring pattern is formed only on one of the surfaces. As a result, the LED chips 16A can be prevented from heating up when being driven, whereby the product life can be prolonged.

The wiring patterns 519B are arranged toward the bottom plate 14a of the chassis 14. In other words, the wiring patterns 519B are arranged closer to the bottom plate 14a than the wiring patterns 519A. Therefore, heat release from the wiring patterns 519B is facilitated better than that from the wiring pattern 519A because of heat release through the bottom plate 14a. Therefore, setting the area of the wiring pattern 519B larger than the area of the wiring pattern 519A is more effective. Further, the chassis 14 is metallic, and therefore is higher in thermal conductivity than synthetic resins or the like. Therefore, heat can be more effectively released to the outside of the backlight unit 12 through the wiring patterns 519B and the chassis 14.

<Seventh Embodiment>

Next, a seventh embodiment of the present invention will be described with reference to FIG. 16. Note that, in the seventh embodiment described herein, the same reference symbols are used for parts having the same names as those in the above described embodiments, and redundant explanations on structures, operations and effects are omitted. In each of the above embodiments, the housing portions 50 configured to house the connecting components 60 are formed by denting the bottom plate 14a of the chassis 14. In contrast, the present embodiment employs a configuration in which, in a bottom plate 614a, a housing portion 650 dented into the back side is formed by applying a drawing process to a part facing the connecting component 60. Because each of the above described embodiment has a configuration obtained by putting dents in the bottom plate 14a, the depth of the housing portions 50 is limited by the thickness of the bottom plate 14a. In this regard, the present embodiment makes it possible to set the depth of the housing portion 650 regardless of the thickness of the bottom plate 614a because the housing portions 50 are formed by applying drawing to the bottom plate 14a. Additionally, the present embodiment is provided with an advantage in terms of the production cost of the chassis 14.

Further, in the present embodiment, the configuration of each of the LEDs and the configurations of peripheral components (a reflection sheet and a diffuser lens to be described below) of the LED are different from those in each of the above embodiments. The configurations of the LED and the peripheral components of the LED will be described below. Each LED 616 in the present embodiment includes a base end portion 616b and a top end portion 616a which has a hemispherical shape. The LED 616 is configured to emit white light by using an LED chip that emits blue light of a single color and a fluorescent material in combination. Further, the back surface of the base end portion 616b of the LED 616 is soldered to the wiring pattern 19A (illustration of which is omitted in FIG. 16) formed on the LED board 17.

Diffuser lenses 620 are arranged on the front surfaces of the respective LEDs 616. Each of the diffuser lenses 620 is formed of a transparent member (for example, acrylic or polycarbonate) having a refractive index higher than that of air. The diffuser lens 620 functions to refract and thereby diffuse light emitted from the LED 616. The diffuser lens 620 has a circular shape in a plan view, and the LED 616 placed at the center thereof. The diffuser lens 620 is provided on the LED board 17 so as to cover the front side of the LED 616. The diffuser lens 620 includes a base portion 620A having a flat plate-like shape which is circular in a plan view, and a flat spherical portion 620B having a flat hemispheric shape. From the periphery of the base portion 620A in a plan view, a leg portion 628 is provided so as to protrude to the back side. The diffuser lens 620 is fixed to the LED board 17 by bonding this leg portion 628 to the LED board 17 by use of, for example, an adhesive agent or a thermosetting resin.

Figure 16:
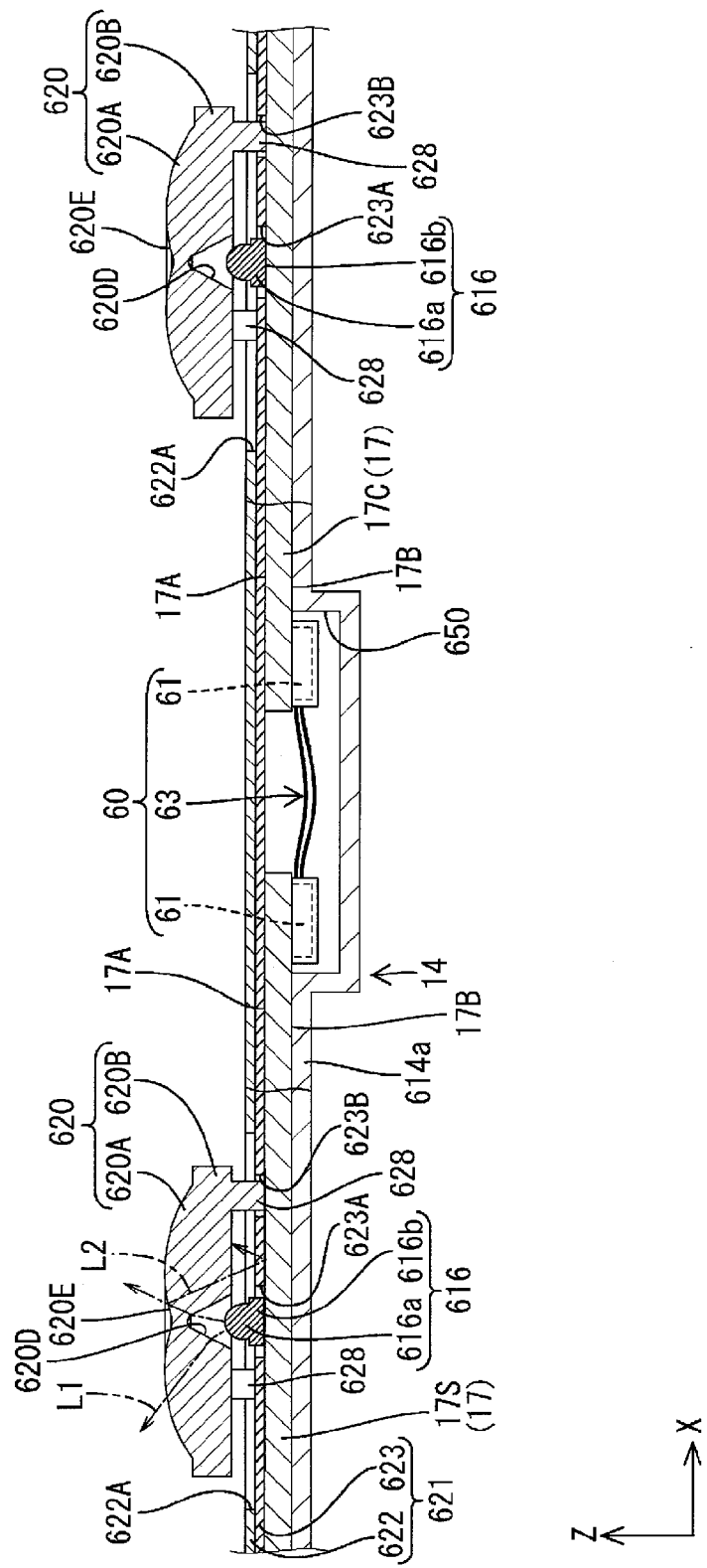
FIG. 16 is an enlarged cross-sectional view of the circumference of the LED according to a seventh embodiment of the present invention.

The diffuser lens 620 has a concave portion 620D, having a substantially conical shape, formed in a lower surface thereof by denting a place located immediately above the LED 616 to the front side (upper side in FIG. 16). The diffuser lens 620 also has a concave portion 620E, having a substantially mortar-like shape, formed in a top portion thereof. The inner circumferential surface of the concave portion 620E has an arc-like shape in a cross-sectional view. Due to the above configuration, light from the LED 616 is refracted on a boundary between the diffuser lens 620 and air over a wide angle and is diffused to the circumference of the LED 616 (an arrow L1 in FIG. 16). Additionally, some of the light is reflected on a boundary between the diffuser lens 620 and air in the concave portion 620E (an arrow L2 in FIG. 16). Occurrence of a phenomenon where the top of the head of the diffuser lens 620 becomes brighter than the surrounding region thereof can be thereby prevented, whereby uneven brightness is suppressed. Light emitted from the LED 616 is thus diffused by the diffuser lens 620, whereby, even with a distance between mutually adjacent ones of the LEDs 616 being hypothetically set large, a region between the adjacent ones is made less likely to be visually recognized as a dark portion. Therefore, the total number of the LEDs 616 arranged on the inner surface of the chassis 14 can be smaller, and power consumption and the cost of the components associated with the LEDs 616 can be reduced.

In the present embodiment, a reflection sheet 621 includes a first reflection sheet 622 which almost entirely covers the inner-surface side of the bottom plate 14a and the side plates 14b of the chassis 14, and a second reflection sheet 623 which covers the respective LED boards 17 individually. The first reflection sheet 622 and the second reflection sheet 623 are, for example, made of synthetic resin, and the surfaces thereof are set in a white color which has excellent reflectivity. The present embodiment employs a configuration in which, after the second reflection sheet 623 is placed over the light source mounted surfaces 17A of the LED boards 17, the first reflection sheet 622 is placed over the second reflection sheet 623 from the front side. In the first reflection sheet 622, while lens insertion holes 622A each set at a diameter that allows the diffuser lens 620 to be inserted therein are formed at locations corresponding to the respective diffuser lens 620 in a plan view, parts of the second reflection sheet 623 are arranged so as to overlap with the lens insertion holes 622A in a plan view. Additionally, light source through holes 623A and leg-portion insertion holes 623B are formed in the second reflection sheet 623, the light source through holes 623A each being configured to have the LED 616 inserted therein, the leg-portion insertion holes 623B each being configured to have the leg portion 628 of the diffuser lens 620 inserted therein. Further, also in the present embodiment, the connecting components 60 are mounted on the connecting component attached surfaces 17B, whereby it is made possible to lay down the first reflection sheet 622 and the second reflection sheet 623 without causing therein any bending attributable to the connecting components 60.

Next, effects obtained by including the first reflection sheet 622 and the second reflection sheet 623 will be described. In the present embodiment, the diffuser lenses 620 are fixed to the LED boards 17, and the lens insertion holes 622A used for having the diffuser lenses 620 inserted therein are formed in the first reflection sheet 622. This makes it possible to, when the diffuser lenses 620 are inserted in the lens insertion hole 622A, put the diffuser lenses 620 in a state projecting from the front side of the first reflection sheet 622 and, at the same time, lay down the first reflection sheet 622. In addition, the present embodiment adopts a configuration in which the second reflection sheet 623 is arranged in regions overlapping with the lens insertion holes 622A in a plan view. Adoption of this configuration makes it possible both to have the configuration including the diffuser lenses 620 and having the lens insertion holes 622A formed, and to, when light has entered regions corresponding to the lens insertion holes 622A, reflect the light by the second reflection sheet 623 toward the front side (in particular, toward the diffuser lens 620). Therefore, brightness can be increased as compared to a configuration including only the first reflection sheet 622.

<Eighth Embodiment>

Next, an eighth embodiment of the present invention will be described with reference to FIGS. 18 and 19. Note that, in the eighth embodiment described herein, the same reference symbols are used for parts having the same names as those in the above described embodiments, and redundant explanations on structures, operations and effects are omitted. In each of the above embodiments, the LED board 17C (the second light source board) is given as an example of the other board to be electrically connected to the LED board 17S (the first light source board), and a configuration in which the connecting component 60, configured to electrically connect these two LED boards 17 to each other, is arranged on the connecting component attached surfaces 17B is given as an example. In contrast, a power board 717 is given as an example of the other board in the present embodiment. In addition, the present embodiment adopts a configuration in which a connecting component 760 is arranged on the connecting component attached surfaces 17B of the LED boards 17, the connecting component 760 being configured to electrically connect the LED board 17S and the power board 717 to each other.

Figure 18:
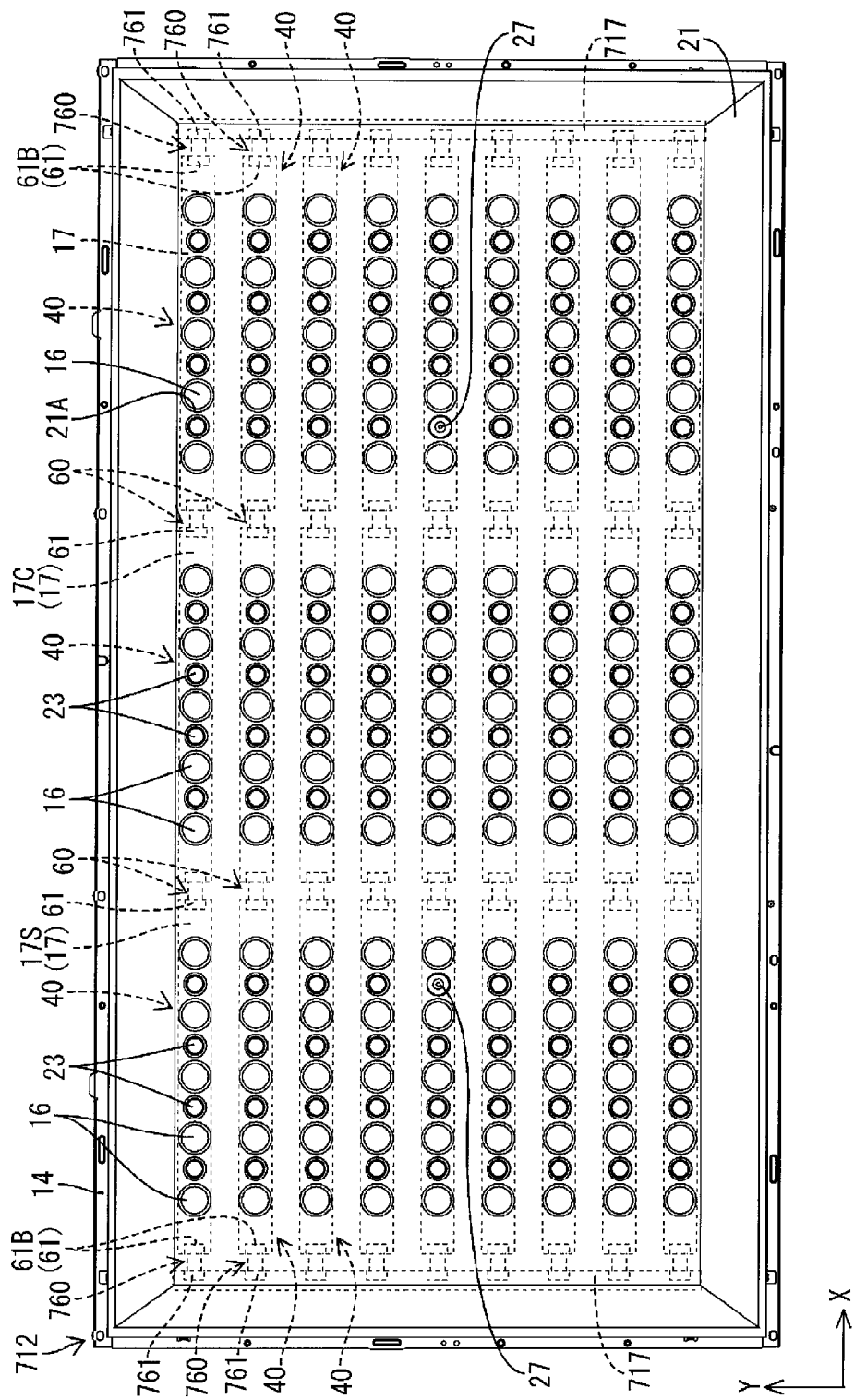
FIG. 18 is a plan view showing a backlight unit according to an eighth embodiment of the present invention.

As shown in FIG. 18, in a backlight unit 712 in the present embodiment, each of the power boards 717 has a shape extending in the Y-axis direction, and the respective power boards 717 are attached to the opposite ends of the inner surface of the chassis 14 in the X-axis direction. The configuration here is such that, with power supply units, which are not illustrated, being mounted on the respective power boards 717, power is supplied to the LEDs 16 on the LED boards 17 by having the power supply units electrically connected through the connecting components 760 to the LED boards 17S (first light source boards) arranged in the respective ends in the X-axis direction.

Figure 19:
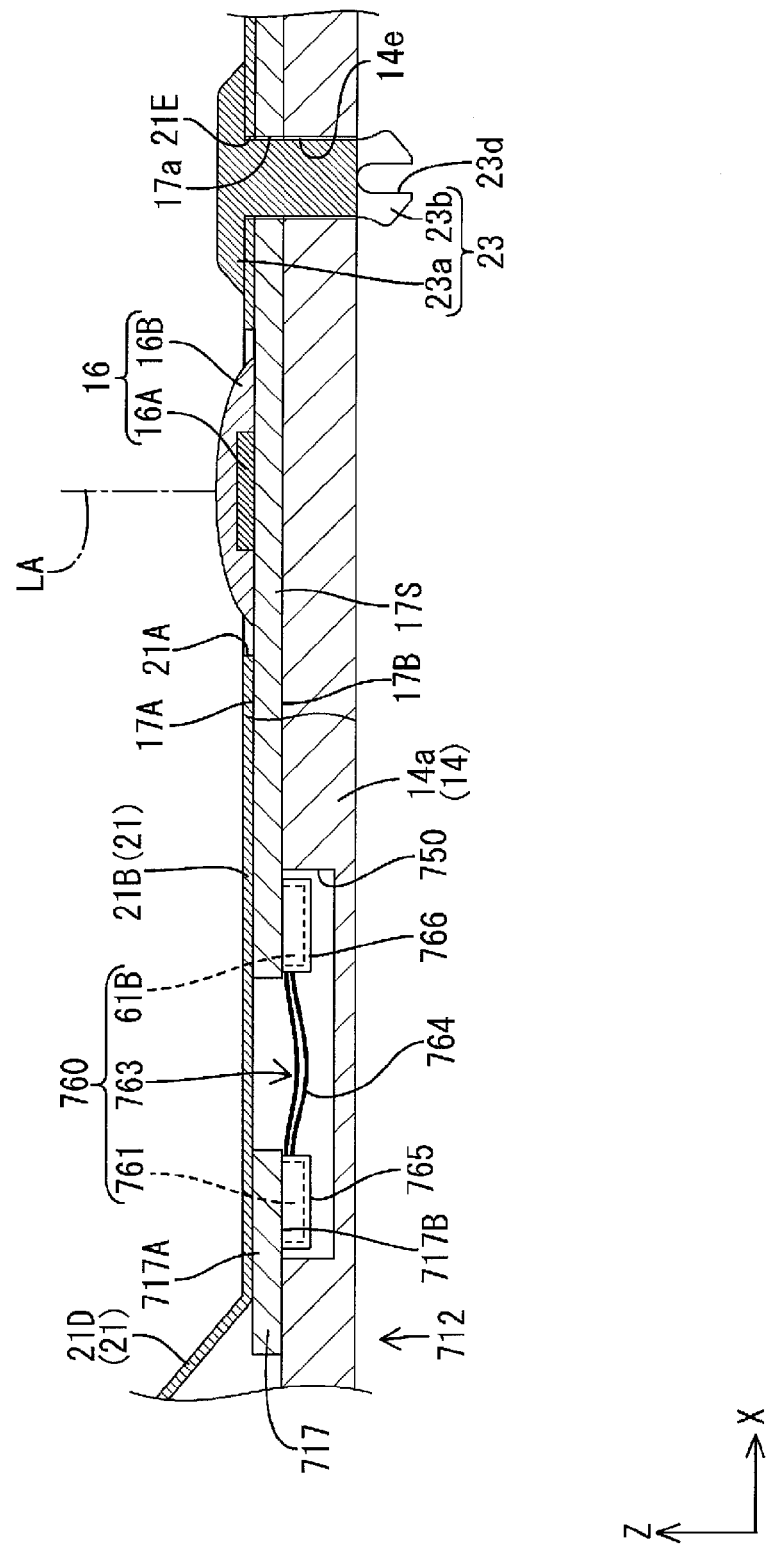
FIG. 19 is a cross-sectional view showing a structure for coupling together an LED board and a power board.

As shown in FIG. 19, the connecting component 760 includes a board mounted connector 61B mounted on the connecting component attached surface 17B of the LED board 17S, a board mounted connector 761 mounted on a back face 717B of the power board 717, and a relay component 763 to electrically connect the board mounted connector 761 and the board mounted connector 61B to each other. The relay component 763 includes electric wires 764 and relay connectors 765 and 766. Each of the electric wires 764 is obtained, for example, by coating a conducting wire made of a metallic material such as copper with a flexible coating material such as polyvinyl chloride. The relay connectors 765 and 766 are being connected to both ends of the electric wire 764. While the board mounted connector 61B and the relay connector 766 can be fitted with each other, the board mounted connector 761 and the relay connector 765 can be fitted with each other. This results in a configuration in which electrical connection between the power board 717 and the LED board 17S is established by fitting the board mounted connectors 61B and 761 with the respective relay connector 765 and 766.

As shown in FIG. 19, a housing portion 750 configured to house the connecting component 760 is formed by denting a position, on the inner surface of the bottom plate 14a (bottom) of the chassis 14, that faces the connecting component 760. In this configuration, while the connecting component 760 is arranged on the connecting component attached surface 17B (face that faces the bottom plate 14a of the chassis 14) of the LED board 17S, the LED board 17S and the power board 717 can be installed on the bottom plate 14a without causing interference between the connecting component 760 and the bottom plate 14a. In the present embodiment, the bottom portion 21B of the reflection sheet 21 is arranged so as to be placed over the light source mounted surfaces 17A of the LED boards 17S and parts of the front surface the power boards 717.

As described above, in the present embodiment, a part of the connecting component 760 (board mounted connector 61B) to electrically connect the LED board 17S and the power board 717 to each other is arranged on the connecting component attached surface 17B of the LED board 17S, and the connecting component 760 is arranged on the connecting component attached surface 17B side. A surface onto which the reflection sheet 21 is laid down therefore forms a flat face in the periphery of a location at which the LED board 17S and the power board 717 are coupled together. The reflection sheet 21 can be thereby prevented from bending at the location at which the LED board 17S and the power board 717 are coupled together, whereby uneven brightness due to the bending can be prevented.

Note that any one of the same configurations (such as a configuration having a part of a relay component penetrating an insertion hole, and a configuration from which a relay component is eliminated) as those described in the second to sixth embodiments above may also be applied to the connecting component 760, given as an example in the present embodiment, which couples the LED board 17S and the power board 717 together. Since operations and effects in a case of applying this configuration are the same as in the case of the connecting component which couples the LED boards together, explanations thereof are omitted.

<Other Embodiments>

The present invention is not limited to the embodiments described by the above description and the drawings, and, for example, the following embodiments are also included in the technical scope of the present invention.

(1) Although each of the relay components in the above embodiments includes electric wires and relay connectors, the present invention is not limited to this configuration. Any relay component to electrically connect board mounted connectors to each other is applicable.

(2) Although each of the connecting components 60 in the above embodiments is configured to connect the LED boards 17 that are mutually adjacent in the X-axis direction, the present invention is not limited to this configuration. The connecting component 60 may be configured to connect the LED boards 17 that are mutually adjacent in the Y-axis direction. Alternatively, the connecting component 60 may be configured to connect the LED boards that are not mutually adjacent on the chassis 14.

Figure 17:
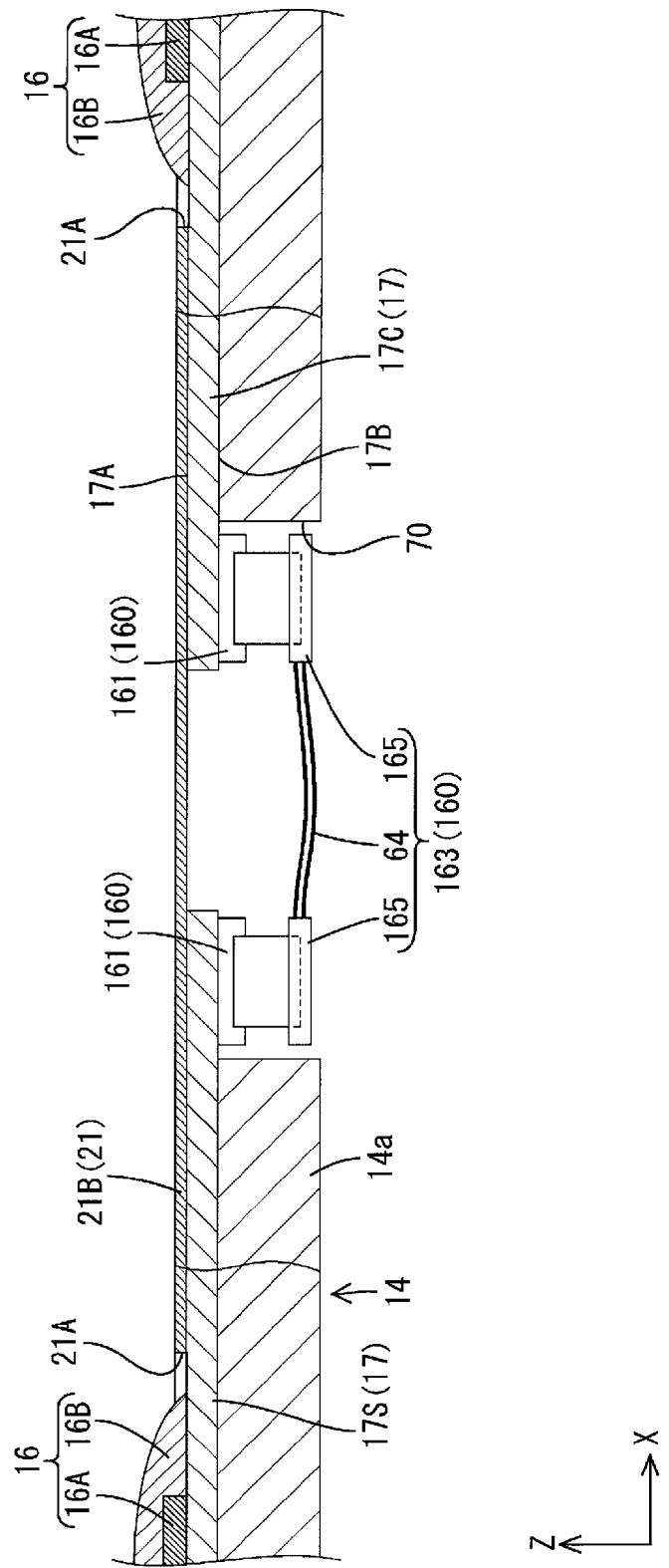
FIG. 17 is a cross-sectional view showing other embodiments.

(3) The second and the third embodiments adopt the configuration in which, after insertion holes 114D are formed at positions corresponding to the board mounted connectors 161 or the relay connectors 265, connections between the board mounted connectors and the relay components are made. However, for example, another configuration in which an insertion hole 70 is formed in the bottom plate 14a of the chassis 14 at a location corresponding to each of the connecting components 160 as a whole as shown in FIG. 17 may be adopted.

(4) The above embodiments adopt the configuration in which only the light source units 40 each having the five LEDs 16 mounted thereon are used in combination to array the LEDs 16. However, for example, another configuration in which light source units of two or more different types, which differ in the number of LEDs 16 mounted thereon may be used in combination.

(5) Although the LED 16 including the blue light emitting LED chip 16A and a fluorescent material is given as an example in the above embodiments, the present invention is not limited to this. For example, the LED 16 may be one that emits white light by including a blue light emitting LED chip, a red light emitting LED chip and a fluorescent material that has a light emission peak in the green region. Alternatively, the LED 16 may be configured to emit white light by including a blue light emitting chip, a red light emitting chip and a green light emitting chip. Alternatively, the LED may be configured to include a UV light emitting LED chip and a fluorescent material. As an example of the fluorescent material in this case, a fluorescent material that has light emission peaks in the blue, green and red regions. Alternatively, the LED may be configured to include LEDs of three kinds in combination each of which emits light of a single color out of R (red), G (green) and B (blue).

(6) Configurations applied to the diffuser 15a and the optical sheet 15b may be different from those described in the above embodiments, and may be modified as appropriate. Specifically, the number of the diffusers 15a and the number of the optical sheets 15b, and the kinds thereof may be modified as appropriate. Plural ones of the optical sheets 15b of the same kind may be used.

(7) Although the configuration having the LEDs 16 arrayed two-dimensionally inside the chassis 14 is given as an example in the above described embodiments, a configuration in which the LEDs 16 are arrayed linearly may be adopted. Specifically, another configuration having the LEDs 16 arranged only in the vertical direction or arranged only in the horizontal direction is included in the present invention.

(8) Although the configuration in which the LEDs 16 are used as light sources is given as an example in the above described embodiments, another configuration in which light sources other than LEDs are used may be adopted.

(9) The configuration in which the chassis 14 is arranged with a direction along the short sides thereof being matched to the vertical direction is given as an example in the above described embodiments. However, another configuration in which the chassis 14 is arranged with a direction along the long sides thereof being matched to the vertical direction may be adopted.

(10) Although the shape of the light source through hole 21A is set circular in a plan view in the above embodiments, the present invention is not limited to this. The shape of the light source through hole 21A may have any shape as long as it allows the LED 16 to penetrate the hole, and may have a noncircular shape that corresponds to the shape of the LED 16. For example, when the LED 16 has a rectangular shape in a plan view, the light source through hole 21A may accordingly have a rectangular shape in a plan view.

(11) The first embodiment described above adopts the configuration in which, after the through hole 17D is formed in the LED board 17, electrical connection between the connector 61 on the board side and the wiring pattern 19A is established via the plating 18 by applying the plating 18 to this through hole 17D. An alternative configuration may be adopted in which electrical connection between the connector 61 on the board side and the wiring pattern 19A is established via conductive paste shown in the sixth embodiment with this conductive paste inserted in the through hole 17D, instead of the plating 18.

(12) The seventh embodiment described above adopts the configuration in which the housing portion 650 dented to the back side is formed in the bottom plate 614a of the chassis 14 by applying drawing to a location therein facing the connecting component 60. This configuration is also applicable to the bottom plate 14a in the first to sixth embodiments described above.

(13) The configuration including the diffuser lenses 620 covering the respective LEDs 616 is given as an example in the seventh embodiment described above. Each of the first to sixth embodiments and the eighth embodiment described above may also be configured to have the diffuser lenses 620 so as to cover the LEDs 16. Further, the reflection sheet 621 is configured to include the two reflection sheets 622 and 623 by including the diffuser lenses 620. This configuration is also applicable to the first to sixth embodiments and the eighth embodiment described above.

(14) Although a TFT is used as a switching component of the liquid crystal display device in the above described embodiments, the present invention is also applicable to a liquid crystal display device using a switching component (for example, a thin film. diode (TFD)) other than a TFT, and is also applicable to a liquid crystal display device not equipped for color display such as a liquid crystal display device that displays monochrome images.

(15) Although the chassis 14 is metallic in the above described embodiments, the chassis 14 may be, for example, made of synthetic resin. In this manner, the chassis 14 can be made lighter in weight and less expensive.

(16) Although the liquid crystal display device 10 using the liquid crystal panel 11 is given as an example of a display component in the above described embodiments, the present invention is applicable to a display device using a display component of another type.

(17) Although the television receiver TV including the tuner T is given as an example in the above described embodiments, the present invention is also applicable to a display device that does not include a tuner.

Figure 21:
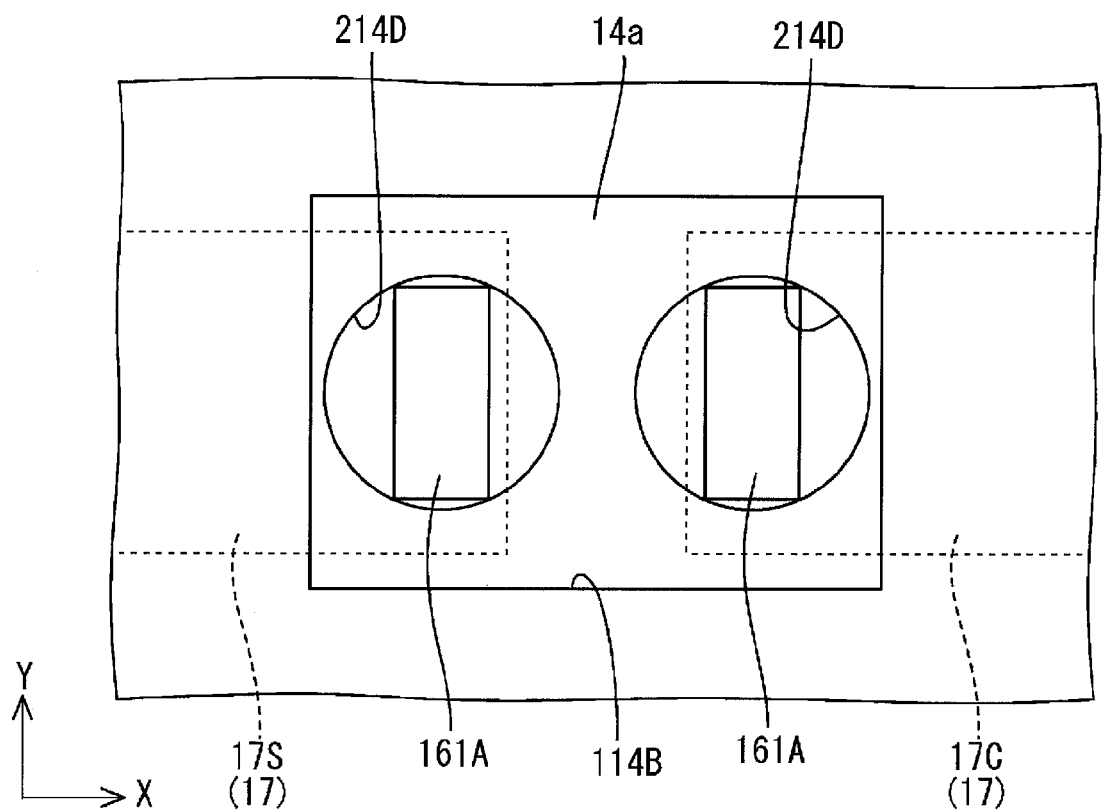
FIG. 21 is a plan view, from the back side, of a chassis having circular through holes formed therein.

(18) In the second embodiment described above, the configuration in which the insertion hole 114D configured to have the top end portion 161A of the board mounted connector 161 inserted therein has a substantially square shape in a plan view is given as an example. The shape of the insertion hole 114D may be any shape as long as it allows the top end portion 161A of the connector to be inserted therein. For example, as shown in FIG. 21, each through hole (through hole 214D) may have a substantially circular shape in a plan view. Alternatively, as shown in FIG. 22, each through hole (through hole 314D) may have a substantially triangular shape in a plane view.

(19) Although the LED board 17C or the power board 717 is given as an example of the other board, which is different from the first light source board, in the above described embodiments, the present invention is not limited to this. Any board to be electrically connected to the first light source board via a connecting component is applicable as the other board.

The invention claimed is:

1. A lighting device, comprising:
a plurality of light sources;
a first light source board on which the light sources are mounted;
another board different from the first light source board;
a board attachment member to which both of the first light source board and the other board are attached;
a connecting component electrically connecting the first light source board and the other board to each other; and
a reflection sheet overlaid on a mounting surface of the first light source board, the mounting surface on which the light sources are mounted; wherein
the connecting component is arranged on a connecting component attached surface of the first light source board opposite to the surface on which the reflection sheet is overlaid;
the connecting component includes:
board mounted connectors mounted on the first light source board and the other board, respectively; and
a relay component electrically connected to the respective board mounted connectors; and
the board attachment member has an insertion hole in an area of a bottom thereof opposite the board mounted connector, through which the relay component or the board mounted connector is passed and a part of the relay component or a part of the board mounted connector is inserted therein.

2. The lighting device according to claim 1, wherein:
the relay component is arranged on the board attachment member so as to face the board mounted connectors; and
the board mounted connectors and the relay component are connected to each other along with the attachment of the first light source board to the board attachment member.

3. The lighting device according to claim 1, wherein the insertion hole has a substantially square shape in a plane view.

4. The lighting device according to claim 1, wherein the insertion hole has a substantially circular shape in a plan view.

5. The lighting device according to claim 1, wherein the insertion hole has a substantially triangular shape in a plan view.

6. The lighting device according to claim 1, wherein the relay component is housed in a relay component housing portion formed by denting an outer surface of the bottom of the board attachment member.

7. The lighting device according to claim 1, wherein the relay component includes an electric wire and relay connectors connected to ends of the electric wire, respectively, and fitted with the respective board mounted connectors.

8. The lighting device according to claim 1, wherein the first light source board includes:
a first wiring arranged on the surface on which the light sources are mounted and electrically connected to the light sources;
a second wiring arranged on the connecting component attached surface and electrically connected to the connecting component; and
a third wiring electrically connecting the first wiring and the second wiring to each other.

9. The lighting device according to claim 1, wherein, the reflection sheet has light source through holes through which the respective light sources are passed, the light source through holes being formed at locations corresponding to the respective light sources in a plan view.

10. The lighting device according to claim 1, wherein the other board is a second light source board on which the light sources are mounted.

11. The lighting device according to claim 1, wherein the other board is a power board used for supplying power to the light sources.

12. The lighting device according to claim 1, wherein the light sources are light emitting diodes.

13. The lighting device according to claim 12, wherein each of the light emitting diodes includes a blue light emitting chip and a fluorescent material having a light emission peak in a yellow region, and is configured to emit white light.

14. The lighting device according to claim 12, wherein each of the light emitting diodes includes a blue light emitting chip and a fluorescent material having light emission peaks in green and red regions, and is configured to emit white light.

15. The lighting device according to claim 12, wherein each of the light emitting diodes includes a blue light emitting chip, a red light emitting chip and a fluorescent material having a light emission peak in a green region, and is configured to emit white light.

16. The lighting device according to claim 12, wherein each of the light emitting diodes includes a blue light emitting chip, a red light emitting chip and a green light emitting chip, and is configured to emit white light.

17. The lighting device according to claim 12, wherein each of the light emitting diodes includes an ultraviolet light emitting chip and a fluorescent material, and is configured to emit white light.

18. The lighting device according to claim 12, wherein each of the light emitting diodes includes an ultraviolet light emitting chip and a fluorescent material having light emission peaks in blue, green and red regions, and is configured to emit white light.

19. A display device comprising:
the lighting device according to claim 1; and
a display panel configured to display by using light emitted from the lighting device.

20. The display device according to claim 19, wherein the display panel is a liquid crystal panel using liquid crystals.

21. A television receiver comprising the display device according to claim 19.

* * * * *